(12) United States Patent
Tomita

(10) Patent No.: US 7,319,349 B2
(45) Date of Patent: Jan. 15, 2008

(54) SEMICONDUCTOR INTEGRATED CIRCUIT

(75) Inventor: Hiroyoshi Tomita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 46 days.

(21) Appl. No.: 11/043,333

(22) Filed: Jan. 27, 2005

(65) Prior Publication Data

US 2006/0066374 A1 Mar. 30, 2006

(30) Foreign Application Priority Data

Sep. 28, 2004 (JP) ............................. 2004-281723

(51) Int. Cl.
*H03L 7/00* (2006.01)
(52) U.S. Cl. ...................... 327/144; 327/163
(58) Field of Classification Search ............... None
See application file for complete search history.

(56) References Cited

U.S. PATENT DOCUMENTS

| | | | | |
|---|---|---|---|---|
| 5,550,515 A | * | 8/1996 | Liang et al. ................ | 331/11 |
| 5,574,756 A | * | 11/1996 | Jeong ........................ | 375/376 |
| 6,194,932 B1 | | 2/2001 | Takemae et al. ............ | 327/158 |
| 6,242,954 B1 | | 6/2001 | Taniguchi et al. .......... | 327/149 |
| 6,329,850 B1 | * | 12/2001 | Mair et al. .................. | 327/107 |
| 6,704,892 B1 | * | 3/2004 | Kurd et al. ................. | 714/724 |
| 2002/0090045 A1 | * | 7/2002 | Hendrickson ............... | 375/376 |

FOREIGN PATENT DOCUMENTS

| | | |
|---|---|---|
| JP | 10-126254 | 5/1998 |
| JP | 10-150350 A | 6/1998 |
| JP | 2000-122750 | 4/2000 |
| JP | 2000-124796 | 4/2000 |
| KR | 10-2004-0020990 A | 3/2004 |

* cited by examiner

*Primary Examiner*—Cassandra Cox
(74) *Attorney, Agent, or Firm*—Arent Fox LLP

(57) ABSTRACT

A phase adjustment unit adjusts the phases of a plurality of external clocks successively shifted in phase, thereby generating a plurality of internal clocks having an equal phase difference between every adjacent transition edges thereof. The internal clocks are synthesized to generate a composite clock having equal pulse intervals. Thus, even when the semiconductor integrated circuit is supplied with external clocks of lower frequencies, it is possible to operate the semiconductor integrated circuit at high speed. For example, the internal circuit can be operated and tested at high speed by using a low-cost LSI tester having a low clock frequency. This can reduce the testing cost of the semiconductor integrated circuit, allowing a reduction in chip cost.

10 Claims, 29 Drawing Sheets

SEMICONDUCTOR INTEGRATED CIRCUIT

CROSS REFERENCE TO RELATED APPLICATION

This application is based upon and claims the benefit of priority from Japanese Patent Application No. 2004-281723, filed on Sep. 28, 2004, the entire contents of which are incorporated herein by reference.

BACKGROUND OF THE INVENTION

1. Field of the Invention

The present invention relates to a semiconductor integrated circuit which operates in synchronization with a clock.

2. Description of the Related Art

With the progress of semiconductor processes, the operating frequencies of semiconductor integrated circuits have been increasing year by year. The frequencies of clocks to be supplied to the semiconductor integrated circuits have also been increasing accordingly. To miniaturize systems that implement semiconductor integrated circuits, there has also been developed a technology for laminating a plurality of semiconductor integrated circuit chips in a single package to manufacture an SIP (System in Package). In the SIP assembly process, when an SIP is determined to be defective due to mixing of a single failure chip, then the other good chips packaged together must also be rejected. In other words, for the sake of an improved SIP yield and reduced cost, it is important to examine operation margins in detail and reject chips having margin failures through a probe test. Here, the probe test is a test which is conducted with probes put in direct contact with the pads of semiconductor integrated circuits in a wafer state. Incidentally, not only in SIPs but also in ordinary semiconductor integrated circuits, rejecting chips having margin failures through a probe test can improve the manufacturing yield with a reduction in manufacturing cost.

DLL (Delayed Locked Loop) circuits and SMD (Synchronous Mirror Delay) have been proposed for circuitry technologies for achieving the present invention (disclosed in Japanese Unexamined Patent Application Publications Nos. 2000-124796, 2000-122750, and Hei 10-126254).

To evaluate a semiconductor integrated circuit for an operation margin, the frequency of the clock to be used in a probe test must be set at or higher than the maximum operating frequency of the semiconductor integrated circuit. Testing a semiconductor integrated circuit with clocks of higher frequencies, however, requires expensive LSI testers, which can increase the testing cost. On the other hand, the internal clock frequency can be increased, for example, by implementing a PLL circuit inside the semiconductor integrated circuit. Nevertheless, PLL circuits contain analog circuits and thus are large in circuit area. Consequently, the semiconductor integrated circuit may increase in chip area, with an increase in chip cost. Alternatively, for example, it is possible to generate a clock that has pulses in synchronization with the rising edge and falling edge of an external clock which is supplied to the semiconductor integrated circuit from an LSI tester. This technique, however, can only generate a clock having a frequency twice that of the external clock.

SUMMARY OF THE INVENTION

It is an object of the present invention to provide a circuitry technology in which it is able to evaluate the operation margin a semiconductor integrated circuit even if it is supplied from an LSI tester with clocks with a frequency lower than one necessary for the evaluation. In other words, the object is to test a semiconductor integrated circuit at lower cost by using an LSI tester of a low clock frequency.

According to one of the aspects of the present invention, external clock terminals receive a plurality of external clocks having phases shifted in sequence, respectively. A phase adjustment unit adjusts the phases of the external clocks to generate a plurality of internal clocks with a same phase difference between every adjacent transition edges thereof. A clock composite unit synthesizes the internal clocks to generate a composite clock having a frequency higher than that of the external clocks. An internal circuit operates in synchronization with the composite clock. The phase adjustment unit equalizes all the phase differences between the adjacent internal clocks. All pulse intervals of the composite clock can thus be made equal. Consequently, even when the semiconductor integrated circuit is supplied with external clocks of lower frequencies, it is possible to operate the semiconductor integrated circuit at high speed. For example, the internal circuit can be operated at high speed for testing by using a low-cost LSI tester having a low clock frequency. As a result, it is possible to reduce the testing cost of the semiconductor integrated circuit, allowing a reduction in chip cost.

In a preferred example of one of the aspects of the present invention, the phase adjustment unit includes a plurality of sub phase adjustment units corresponding to the external clocks, respectively, and an average calculation unit. The sub phase adjustment units each have first and second variable delay circuits, a phase comparator, and first and second delay control circuits. The first variable delay circuit delays a corresponding external clock in phase to generate the internal clock. The second variable delay circuit delays the internal clock in phase to generate a comparison clock. The phase comparator compares the phases of the comparison clock and one of the internal clocks generated from one of the external clocks having a transition edge adjacent to that of another one of the external clocks and delaying in phase therefrom. Another one of the external clocks corresponds to the comparison clock. The second delay control circuit adjusts the delay time of the second variable delay circuit in accordance with the result of comparison by the phase comparator in order to make the comparison clock and the internal clock compared by the phase comparator coincide in phase with each other.

The average calculation unit calculates an average delay time, or an average of the delay times of the second variable delay circuits of all the sub phase adjustment units. The first delay control circuit increases the delay time of the first variable delay circuit when the delay time of the second variable delay circuit is longer than the average delay time, and decreases the delay time of the first variable delay circuit when the delay time of the second variable delay circuit is shorter than the average delay time. As a result, the phase differences between the internal clocks and the comparison clocks in all the sub phase adjustment units can be made equal. That is, it is possible to make all the phase differences between the internal clocks equal.

In a preferred example of one of the aspects of the present invention, the first delay control circuit adjusts the delay time of the first variable delay circuit after the delay time of the second variable delay circuit is adjusted and the phase comparator detects a coincidence in phase. Since the delay times of the first and second variable delay circuits are not adjusted simultaneously, it is possible to prevent the phase comparator from detecting coincidence and non-coincidence in phase alternately to cause jitter in the internal clock.

In a preferred example of one of the aspects of the present invention, the phase comparators repeat the phase comparison operation and the first and second delay control circuits repeat the adjustment operations on the delay times. Alternately repeating the delay time adjustment operations of the first and second variable delay circuits makes it possible to equalize the phase differences between the internal clocks at minimum cycles.

In a preferred example of one of the aspects of the present invention, the first delay control circuits of all the sub phase adjustment units adjust the delay times of the first variable delay circuits simultaneously. This can reduce the time to make the phases of the internal clocks coincide with each other.

In a preferred example of one of the aspects of the present invention, the phase adjustment unit includes a plurality of sub phase adjustment units corresponding to the external clocks, respectively. The sub phase adjustment units each have a variable delay circuit, a delay control circuit, a forward delay circuit, a state keeping unit, a backward delay circuit, and a phase comparator. The variable delay circuit generates the internal clock by delaying the corresponding external clock in phase. The forward delay circuit generates a plurality of forward clocks by delaying the internal clock in phase successively. The state keeping unit selects one of the forward clocks having the same phase as that of one of the internal clocks generated from a first adjacent clock, or one of the external clocks having a transition edge adjacent to a corresponding external clock and delaying in phase therefrom. The backward delay circuit generates a backward clock having a phase delayed from that of the selected forward clock by an internal delay time which is a phase difference between the corresponding internal clock and the selected forward clock.

The phase comparator compares the phases of the backward clock and one of the internal clocks generated from a second adjacent clock as one of the external clocks having a transition edge adjacent to the first adjacent clock and delaying in phase therefrom. The delay control circuit adjusts the delay time of the variable delay circuit so as to make the first and second adjacent clocks coincide in phase with ether. As a result, in each of the sub phase adjustment units, the phase differences between three internal clocks can be made equal to each other. That is, it is possible to make all the phase differences between the internal clocks equal.

In a preferred example of one of the aspects of the present invention, the phase adjustment unit stops the phase adjustment operation to the internal clocks in response to an adjustment stop signal which is received at an adjustment stop terminal. That is, the phase adjustment operation can be stopped from exterior of the semiconductor integrated circuit. Consequently, when the adjustment operation is stopped and the phases of the external clocks are changed, the change is reflected directly on phase variations of the internal clocks. It is therefore possible to perform detailed timing margin tests, for example, by changing the phases of the external clocks during testing of the semiconductor integrated circuit.

In a preferred example of one of the aspects of the present invention, the semiconductor integrated circuit has a normal operation mode and a test mode. A selector selects an operation clock received at an operation clock terminal in the normal operation mode, selects the composite clock in the test mode, and transmits the selected clock to the internal circuit. The internal circuit operates in synchronization with the operation clock in the normal operation mode, and operates in synchronization with the composite clock in the test mode. This makes it possible to set a low frequency of the external clocks to be supplied to the semiconductor integrated circuit while tested. The semiconductor integrated circuit can thus be tested by using a low-cost ISI tester, allowing a reduction in testing cost.

In a preferred example of one of the aspects of the present invention, the phase adjustment unit is activated to generate the internal clocks only in the test mode. The phase adjustment unit thus performs no operation in the normal operation mode, which allows a reduction in the power consumption in the normal operation mode.

In a preferred example of one of the aspects of the present invention, the testing unit operates in the test mode to generate in succession a plurality of types of commands for operating the internal circuit, in synchronization with the composite clock. The internal circuit includes a memory core having a plurality of memory cells, and a core control unit for receiving commands in succession and making the memory core perform a read operation or a write operation on the memory cells. Consequently, the semiconductor integrated circuit can be operated for testing simply by supplying the external clocks thereto.

In a preferred example of one of the aspects of the present invention, the memory core has word lines and bit lines connected to the memory cells. The external clock terminals are four in number. The testing unit includes a command generator for successively generating an active command for activating the word lines, a read command or write command for reading or writing data from/to any one of the memory cells connected to an activated word line, a precharging command for precharging the bit lines after inactivation of the word lines, and a deselect command for setting the memory core to an nonoperation state, in synchronization with pulses corresponding to four external clocks of the composite clock, respectively. Consequently, changing the phases of the external clocks after the phase differences between the internal clocks become equal to one another enables free adjustment of the activation timing of the word lines, the read and write timing of data, the precharge timing, and the inactivation timing of the memory cell array. As a result, detailed timing margin tests can be performed for the semiconductor integrated circuit.

In a preferred example of one of the aspects of the present invention, the testing unit has a row address counter, a column address counter, and a data generator. The row address counter generates a row address for selecting the word lines in synchronization with the active command. The column address counter generates a column address for selecting the bit lines in synchronization with the read command and the write command. The data generator generates write data in synchronization with the write command. Consequently, it is possible to make detailed operation tests including a timing margin test on the semiconductor integrated circuit simply by supplying the external clocks thereto.

BRIEF DESCRIPTION OF THE DRAWINGS

The nature, principle, and utility of the invention will become more apparent from the following detailed descrip

DESCRIPTION OF THE PREFERRED EMBODIMENTS

Figure 1:
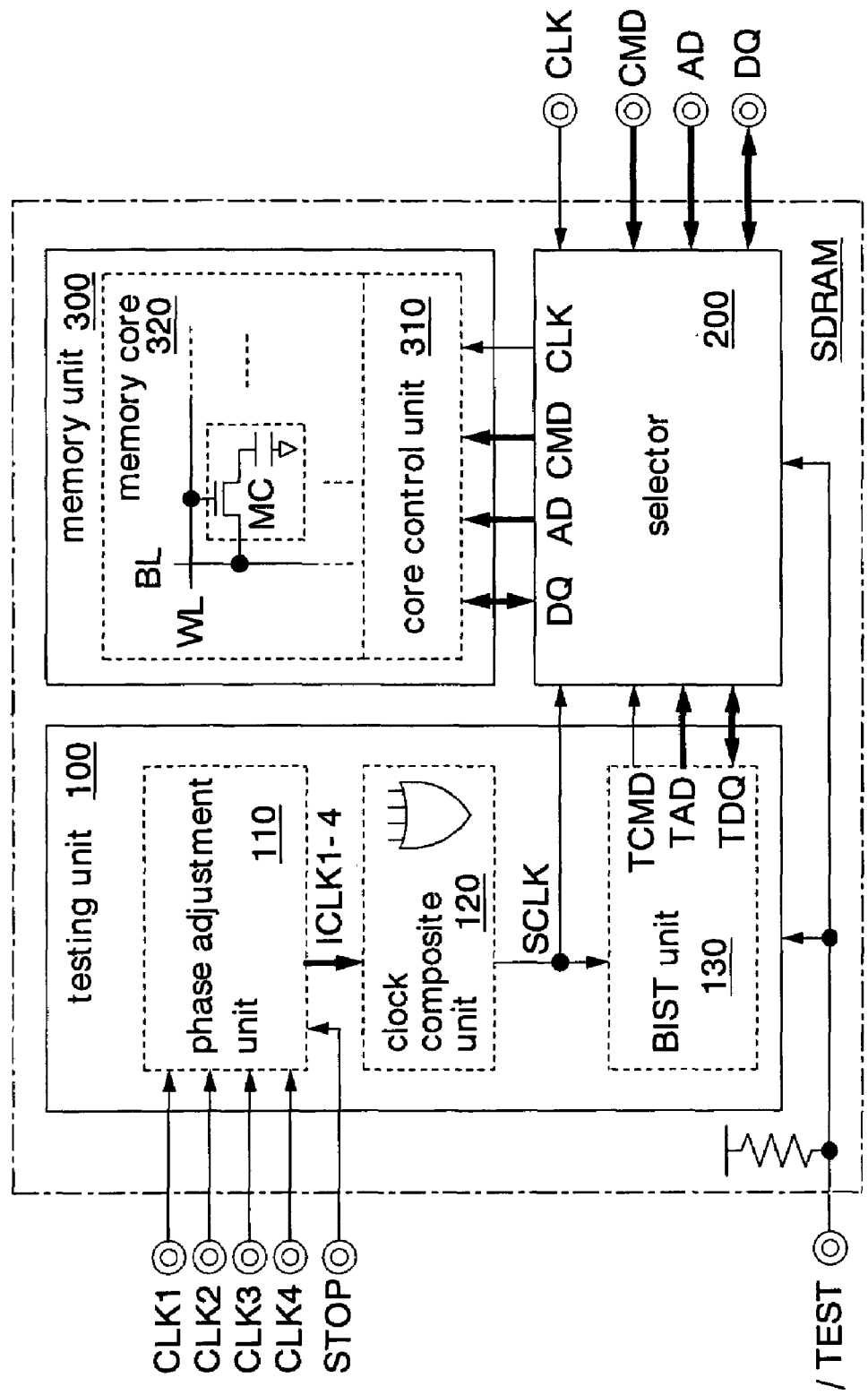
- FIG. 1 is a block diagram showing a first embodiment of the semiconductor integrated circuit of the present invention.

Embodiments of the present invention will be described with reference to the drawings. Double circles in the drawings represent external terminals. In the drawings, each thick line represents a signal line that consists of a plurality of lines. Some of the blocks connected with the thick lines consist of a plurality of circuits each. Signals supplied through the external terminals are designated by reference symbols identical to the names of the terminals. Signal lines for transmitting signals are designated by reference symbols identical to the names of the signals.

FIG. 1 shows a first embodiment of the semiconductor integrated circuit of the present invention. This semiconductor integrated circuit is formed on a silicon substrate by using CMOS processes, as a synchronous DRAM (hereinafter, referred to as SDRAM) of clock synchronous type.

The SDRAM has a testing unit 100, a selector 200, and a memory unit 300 (internal circuit). The testing unit 100 includes a phase adjustment unit 110, a clock composite unit 120, and a built-in self test (BIS) unit 130. The testing unit 100 operates only while a test signal /TEST is activated (in a low level period, in test mode). The testing unit 100 is inactivated to stop operation while the test signal /TEST is inactivated (in a high level period, in normal operation mode). This allows a reduction in power consumption during normal operation mode.

The phase adjustment unit 110 receives external clocks CLK1 to CLK4 which have the same frequencies, and generates internal clocks ICLK1 to ICLK4 which have an equal phase difference between every adjacent transition edges thereof. The smaller the numbers of the external clocks CLK1 to CLK4 are, the more their transition edges lead in phase. That is, the transition edges appear in order of CLK1 to CLK4. During the activation of an adjustment stop signal STOP, the phase adjustment unit 110 stops an adjustment operation on the phases of the internal clocks ICLK1 to ICLK4 to be described later. After the adjustment operation is stopped, changes in the phases of the external clocks CLK1 to CLK4 caused by an LSI tester or the like are reflected directly on variations in the phases of the internal clocks ICLK1 to ICLK4. The clock composite unit 120 determines the logical OR of the internal clocks ICLK1 to ICLK4 output from the phase adjustment unit 110 to generate a composite clock SCLK.

To perform an operation test on the memory unit 300, the BIST unit 130 generates a command TCMD and an address TAD in synchronization with the composite clock SCLK. In a read test, the BIST unit 130 receives read data from the memory unit 300 at its data terminal TDQ. In a write test, the BIST unit 130 outputs write data from the data terminal TDQ.

The selector 200 supplies the composite clock SCLK and the command TCMD, the address TAD, and the data TDQ from the BIST unit 130 to the memory unit 300 during the activation of the test signal /TEST. The selector 200 supplies an operation clock CLK, a command CMD, an address AD, and data DQ supplied through external terminals to the memory unit 300 during the inactivation of the test signal /TEST.

In this example, the composite clock SCLK has the same frequency as that of the operation clock CLK which is used in normal operation mode. The frequencies of the external clocks CLK1 to CLK4 are set at ¼ that of the operation clock CLK. The terminals of the external clocks CLK1 to CLK4, the adjustment stop signal STOP, and the test signal /TEST are formed as test pads. The test pads are connected to none of the terminals of the package on which the SDRAM chip is mounted. In other words, the test pads are used for probe tests alone. In performing a probe test on the SDRAM, the probes of the LSI tester are connected to the terminals except the clock terminal CLK, the command terminal CMD, the address terminal AD, and the data terminal DQ.

The memory unit 300 includes a core control unit 310 and a memory core (memory cell array) 320. The core control unit 310 receives the clocks, commands, and addresses from the selector 200, and outputs control signals for performing a read operation and a write operation to the memory core 320. The address terminals TAD and AD are multiplex terminals common to a row address and a column address. Incidentally, the present invention is also applicable to SDRAMs of address non-multiplex type. The memory core 320 has dynamic memory cells MC arranged in a matrix, word lines WL connected to the memory cells MC aligned in a horizontal direction, and bit lines BL connected to the memory cells MC aligned in a vertical direction.

Figure 2:
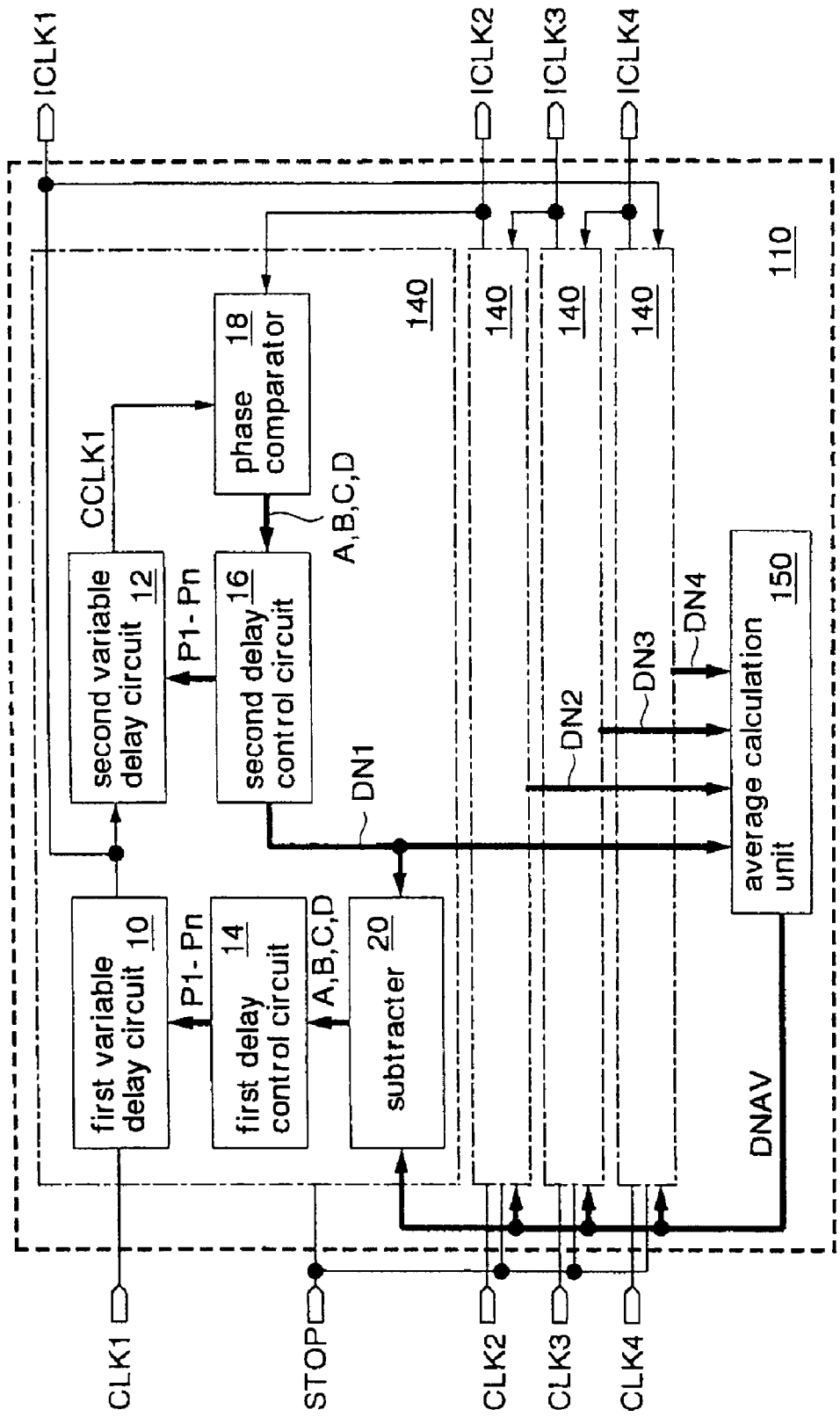
FIG. 2 is a block diagram showing the details of the phase adjustment unit shown in FIG. 1.

FIG. 2 shows the details of the phase adjustment unit 110 shown in FIG. 1. The phase adjustment unit 110 has sub phase adjustment units 140 corresponding to the external clocks CLK1 to CLK4, respectively, and an average calculation unit 150. The sub phase adjustment units 140 each have a first variable delay circuit 10, a second variable delay circuit 12, a first delay control circuit 14, a second delay control circuit 16, a phase comparator 18, and a subtracter 20. The first and second variable delay circuits 10 and 12 are the same circuits. The first and second delay control circuits 14 and 16 are the same circuits. The phase adjustment unit 110 is composed of digital circuits alone, without any analog circuit. This means a small circuit scale.

Since all the sub phase adjustment units 140 have the same circuit configuration, description will be given only of the sub phase adjustment unit 140 that receives the external clock CLK1. The first variable delay circuit 10 is controlled by delay control signals P1 to Pn from the first delay control circuit 14, and delays the external clock CLK1 in phase to generate the internal clock ICLK1. Moreover, by power-on resetting, the first variable delay circuit 10 is reset to a delay time corresponding to the central one of the delay control signals P1 to Pn. Incidentally, the four first delay control circuits 14 operate simultaneously. This minimizes the time necessary for the phase adjustment. The second variable delay circuit 12 is controlled by delay control signals P1 to Pn from the second delay control circuit 16, and delays the internal clock ICLK1 in phase to generate a comparison clock CCLK1. The phase comparator 18 compares the comparison clock CCLK1 and the internal clock ICLK2 in phase, and outputs the result of comparison in the form of control signals A, B, C, and D. By power-on resetting, the second variable delay circuit 12 is also reset to a delay time corresponding to the central one of the delay control signals P1 to Pn. For example, when the clock output from the LSI tester has period of 32 ns, the period of the composite clock SCLK is one quarter, or 8 ns. To generate this composite clock SCLK, each second variable delay circuit 12 must have a maximum delay time of 8 ns or longer. In fact, the maximum delay time of the second variable delay circuit 12 is set at 10 ns or so. At the time of the power-on resetting, the delay time of the second variable delay circuit 12 is set at 5 ns, the center value. Starting a comparison operation from that point can reduce the time until lock-on. The control signals A to D will be detailed in FIG. 11 to be seen later. Here, the internal clock ICLK2 to be compared is the clock generated from the external clock CLK2 which has a transition edge adjacent to and a phase lagging behind those of the external clock CLK1.

The second delay control circuit 16 adjusts the delay time of the second variable delay circuit 12 in accordance with the control signals A to D output from the phase comparator 18. Specifically, the second delay control circuit 16 increases the delay time of the second variable delay circuit 12 when the comparison clock CCLK1 leads the internal clock ICLK2 in phase. The second delay control circuit 16 decreases the delay time of the second variable delay circuit 12 when the comparison clock CCLK1 lags behind the internal clock ICLK2 in phase. The delay time of the second variable delay circuit 12 is adjusted until the comparison clock CCLK1 coincides with the internal clock ICLK2 in phase. The second delay control circuit 16 outputs a delay stage number DN1 which indicates the number of delay stages to be connected corresponding to the current delay time of the second variable delay circuit 12. Incidentally, the four second delay control circuits 16 operate simultaneously. This minimizes the time necessary for the phase adjustment.

The average calculation unit 150 determines the average of the delay stage numbers DN1 to DN4 output from the second delay control circuits 16 of all the sub phase adjustment units 140, and outputs it as an average delay stage number DNAV. That is, the average calculation unit 150 calculates the average of the delay times of the four second variable delay circuits 12, or an average delay time. The average delay stage number DNAV is determined, for example, in the following way. Initially, the delay stage numbers DN1 and DN2 are added and then multiplied by 0.5 to determine the average number of delay stages of the second variable delay circuits 12 corresponding to the external clocks CLK1 and CLK2. Similarly, the delay stage numbers DN3 and DN4 are added and then multiplied by 0.5 to determine the average number of delay stages of the second variable delay circuits 12 corresponding to the external clocks CLK3 and CLK4. The average delay stage number DNAV is determined by adding the two averages and then multiplying the resultant by 0.5.

The subtracter 20 determines a difference between the delay stage number DN1 (or DN2 to DN4) and the average delay stage number DNAV, and outputs the control signals A, B, C, and D to the first delay control circuit 14 in accordance with the difference determined. Based on the difference determined by the subtracter 20, the first delay control circuit 14 increases the delay time of the first variable delay circuit 10 when the delay time of the second variable delay circuit 12 is longer than the average delay time. The first delay control circuit 14 decreases the delay time of the first variable delay circuit 10 when the delay time of the second variable delay circuit 12 is shorter than the average delay time. After the comparison clock CCLK1 and the internal clock ICLK2 coincide with each other in phase, the delay time of the first variable delay circuit 10 is shifted as much as one unit time (the delay time of a single delay stage) by the first delay control circuit 14. Subsequently, the phase comparison operation by the phase comparator 18 and the adjustment to the delay time of the second variable delay circuit 12, and the adjustment to the delay time of the first variable delay circuit 10 by the first delay control circuit 14 are performed alternately until all the phase differences between the internal clocks ICLK1 and ICLK2, ICLK2 and ICLK3, ICLK3 and ICLK4, and ICLK4 and ICLK1 become equal.

In this embodiment, the number of cycles of phase adjustments necessary to make all the phase differences between the internal clocks ICLK1 to ICLK4 equal is evaluated in advance. Here, a single cycle consists of the adjustment operation on the delay time of the second variable delay circuit 12 until the phase comparator 18 shows a coincidence, and the adjustment operation on the delay time of a single stage of the first variable delay circuit 10. The LSI tester for testing the SDRAM activates the adjustment stop signal STOP after a lapse of time corresponding to the number of cycles evaluated in advance. In response to the activation of the adjustment stop signal STOP, the phase adjustment unit 110 stops the phase adjustment operation. Incidentally, after the phase differences between the internal clocks ICLK1 to ICLK4 are all set equally, the phase adjustment unit 110 may stop the phase adjustment operation before receiving the adjustment stop signal STOP.

FIGS. 3 to 6 show an overview of operation of the phase adjustment unit 110 shown in FIG. 2. In the charts, the oblong rectangles show the timings of the rising edges of the external clocks CLK1 to CLK4, the internal clocks ICLK1 to ICLK4, and the comparison clocks CCLK1 to CCLK4. The external clocks CLK1 to CLK4 are given a single period of 32 unit times. The unit of adjustment (unit time) to the delay times of the first and second variable delay circuits 10 and 12 is 0.1 unit times. The numerical values on the left of the rectangles indicate the numbers of delay stages the first variable delay circuits 10 are using to generate the internal clocks ICLK. The numerical values near the center of the rectangles indicate the numbers of delay stages the second variable delay circuits 12 are using to generate the comparison clocks CCLK.

Figure 3:
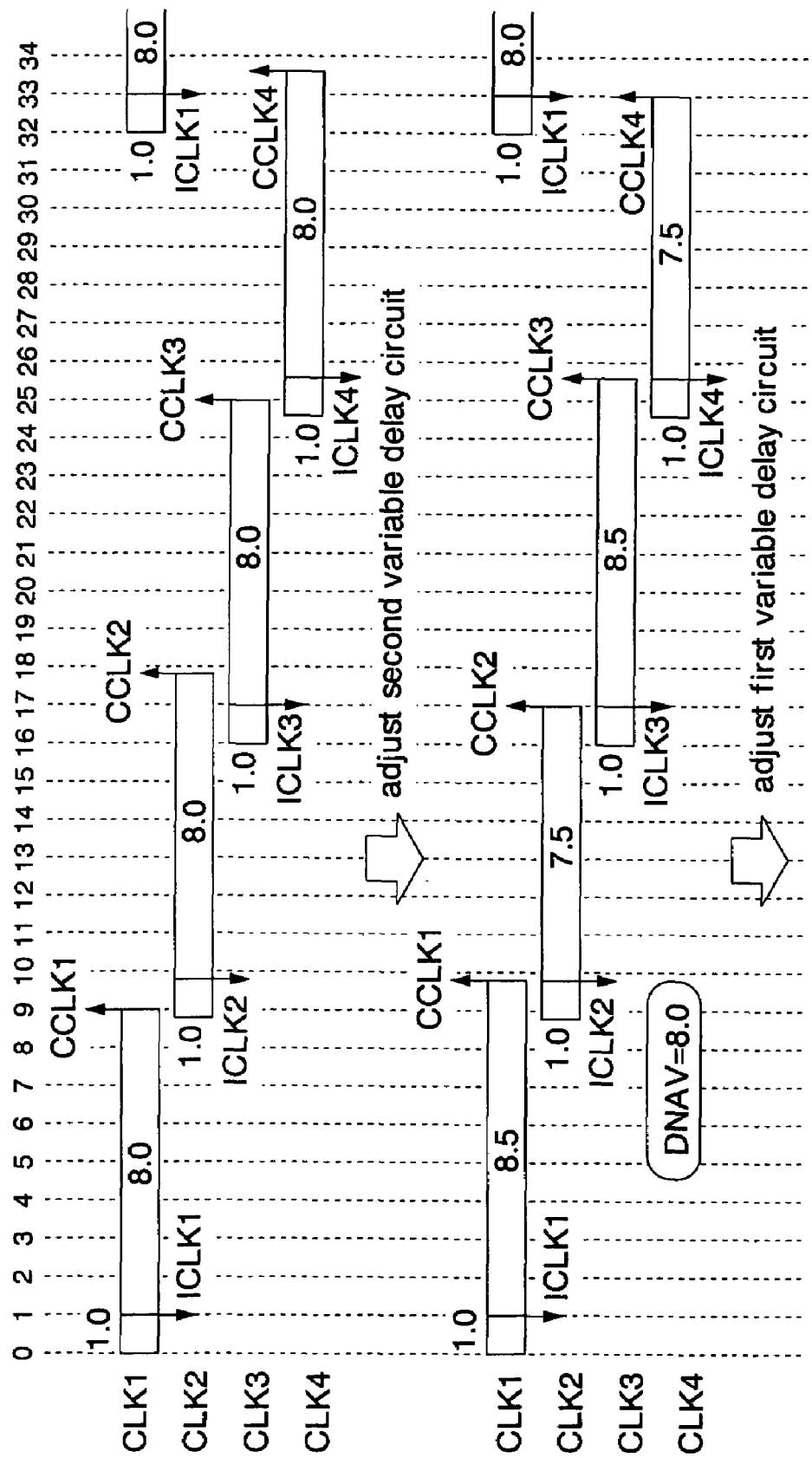
FIG. 3 is an explanatory diagram showing an overview of operation of the phase adjustment unit shown in FIG. 2.

In the upper part of FIG. 3, before the operation of the phase adjustment unit 110, the rising edge of the comparison clock CCLK1 leads the rising edge of the internal clock ICLK2 in phase. Similarly, the comparison clock CCLK2 and the internal clock ICLK3, the comparison clock CCLK3 and the internal clock ICLK4, and the comparison clock CCLK4 and the internal clock ICLK1 also have deviations in phase between their rising edges. The phase adjustment unit 110 initially operates the four phase comparators 18 and the four second delay control circuits 16 corresponding to the external clocks CLK1 to CLK4 simultaneously.

As shown in the lower part of FIG. 3, the rising edges of the comparison clocks CCLK1, CCLK2, CCLK3, and CCLK4 are adjusted in phase to the rising edges of the internal clocks ICLK2, ICLK3, ICLK4, and ICLK1, respectively. The simultaneous operation of the phase comparators 18 and the second delay control circuits 16 minimizes the time required for the phase adjustment. Here, since the first delay control circuits 14 are not in operation, the first variable delay circuits 10 make no change in their delay times. Consequently, the delay times of the second variable delay circuits 12 are adjusted without the effect of variations in the delay times of the first variable delay circuits 10. The average calculation unit 150 determines the average DNAV of the numbers of delay stages which the second variable delay circuits 12 are using to generate the comparison clocks CCLK (in this example, "8"). After the comparison clocks CCLK1, CCLK2, CCLK3, and CCLK4 coincide with the internal clocks ICLK2, ICLK3, ICLK4, and ICLK1 in phase, the phase adjustment unit 110 starts the adjustment to the delay times of the first variable delay circuits 10 by the first delay control circuits 14.

Figure 4:
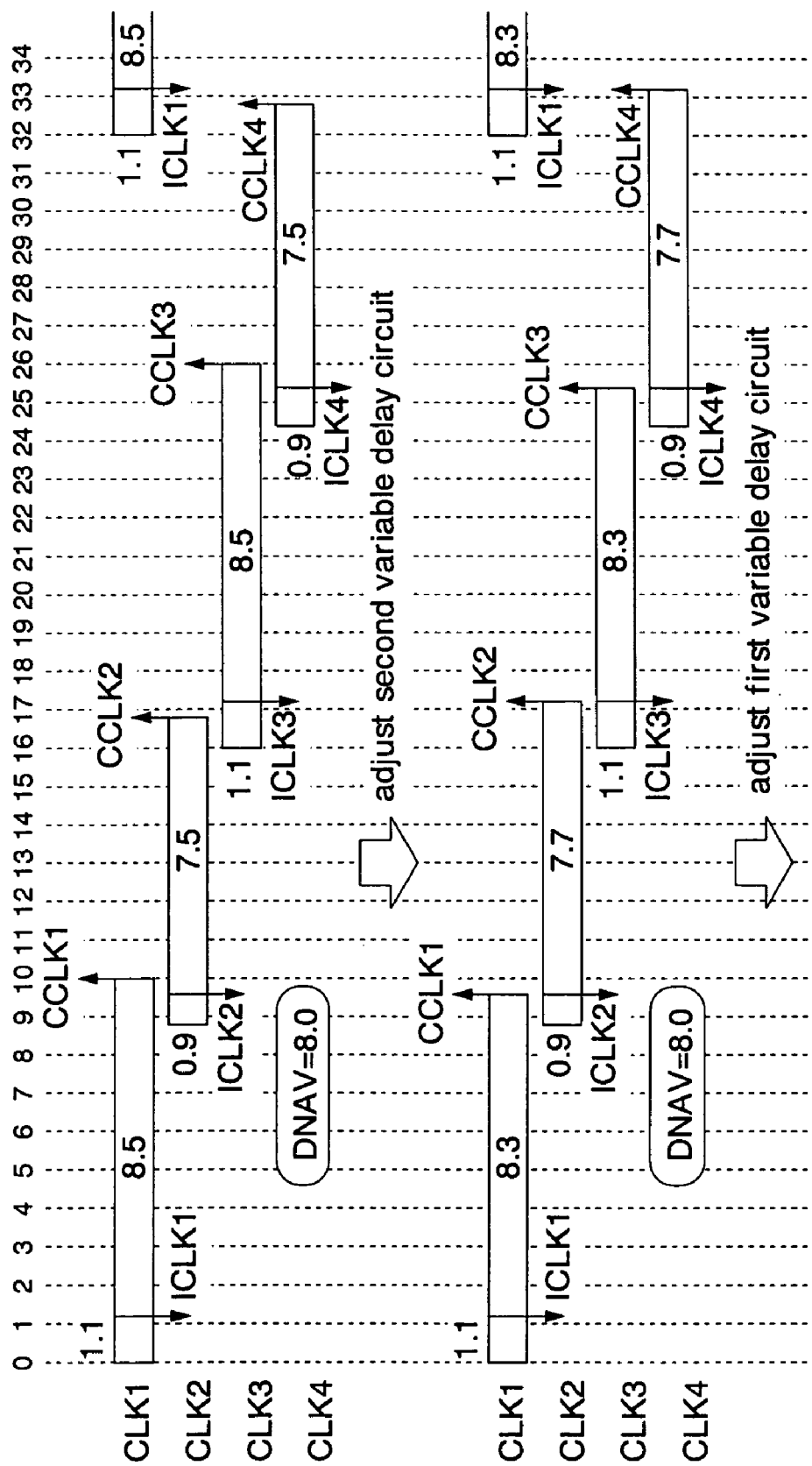
FIG. 4 is an explanatory diagram showing an overview of operation of the phase adjustment unit shown in FIG. 2.

In the upper part of FIG. 4, the subtracter 20 determines that the second variable delay circuit 12 of the sub phase adjustment unit 140 that receives the external clock CLK1 has a delay time (8.5 unit times) longer than the average delay time DNAV (8.0 unit times). The four first delay control circuits 14 operate simultaneously, and the delay time of the first variable delay circuit 10 is increased by 0.1 unit times, or set to 1.1 unit times, based on the result of subtraction from the subtracter 20. Specifically, the number of delay stages the first variable delay circuit 10 is using to generate the internal clock ICLK1 is incremented by one. Similarly, the sub phase adjustment units 140 that receive the external clocks CLK2 to CLK4 adjust the delay times of the first variable delay circuits 10, whereby the rising edges of the internal clocks ICLK2 to ICLK4 vary in phase. Since the second delay control circuits 16 are not in operation, the phases of the comparison clocks CCLK1, CCLK2, CCLK3, and CCLK4 are shifted by the same amounts as the deviations of the phases of the internal clocks ICLK2, ICLK3, ICLK4, and ICLK1. Consequently, the comparison clock CCLK1 (or CCLK2, CCLK3, CCLK4) deviates in phase from the internal clock ICLK2 (or ICLK3, ICLK4, ICLK1). To establish a coincidence between these phases, the delay times of the second variable delay circuits 12 are adjusted again by the second delay control circuits 16. Incidentally, a single cycle of the foregoing phase adjustment consists of the operation in the lower part of FIG. 3 and the operation in the upper part of FIG. 4.

In the lower-part of FIG. 4, the rising edges of the comparison clocks CCLK1, CCLK2, CCLK3, and CCLK4 are adjusted in phase to the rising edges of the internal clocks ICLK2, ICLK3, ICLK4, and ICLK1, respectively, by the same procedure as described above. The delay times of the second variable delay circuits 12 each become 0.2 unit times closer to the average delay time DNAV than in the lower part of FIG. 3. subsequently, the delay times of the first variable delay circuits 10 are adjusted again by the first delay control circuits 14.

Figure 5:
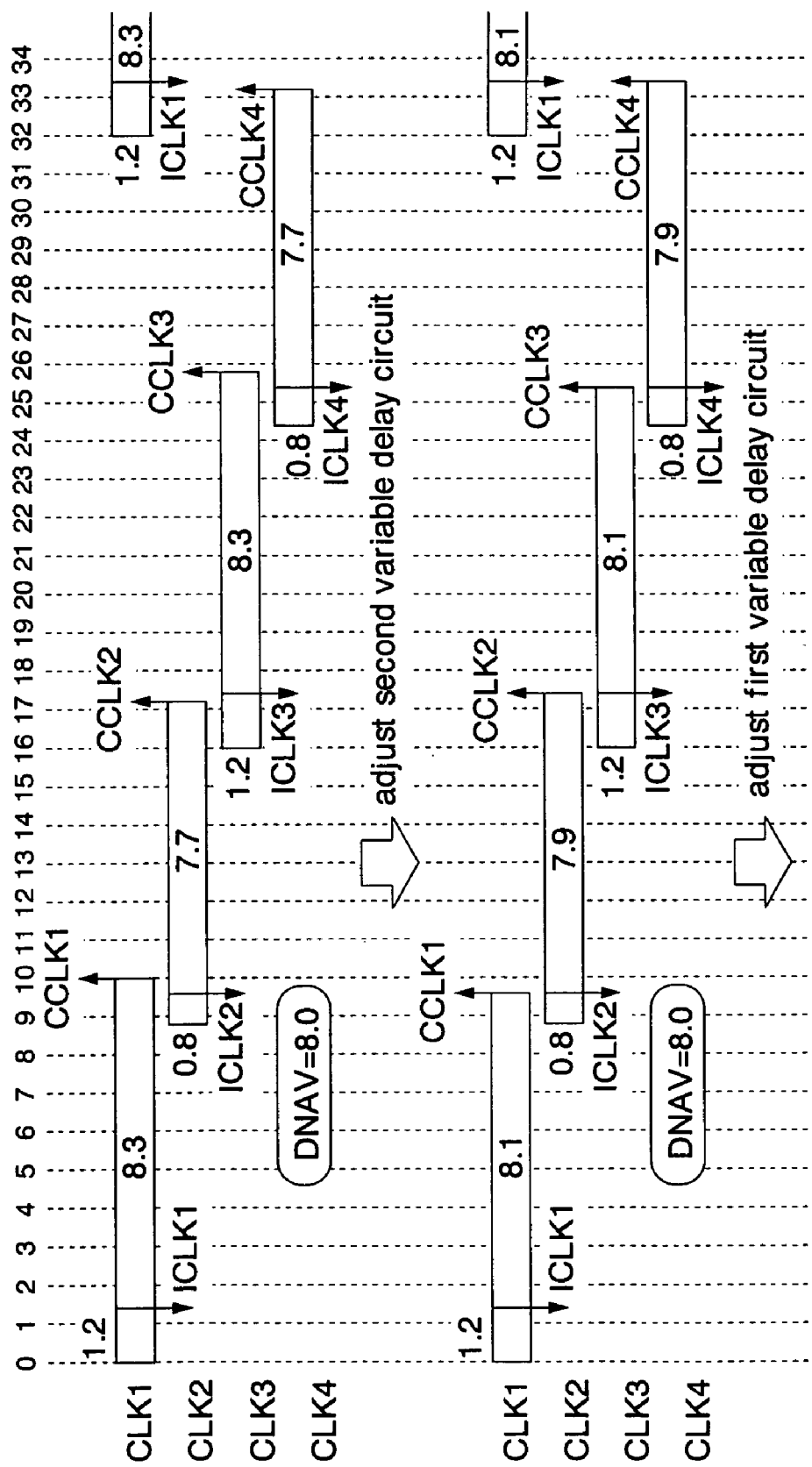
FIG. 5 is an explanatory diagram showing an overview of operation of the phase adjustment unit shown in FIG. 2.
Figure 6:
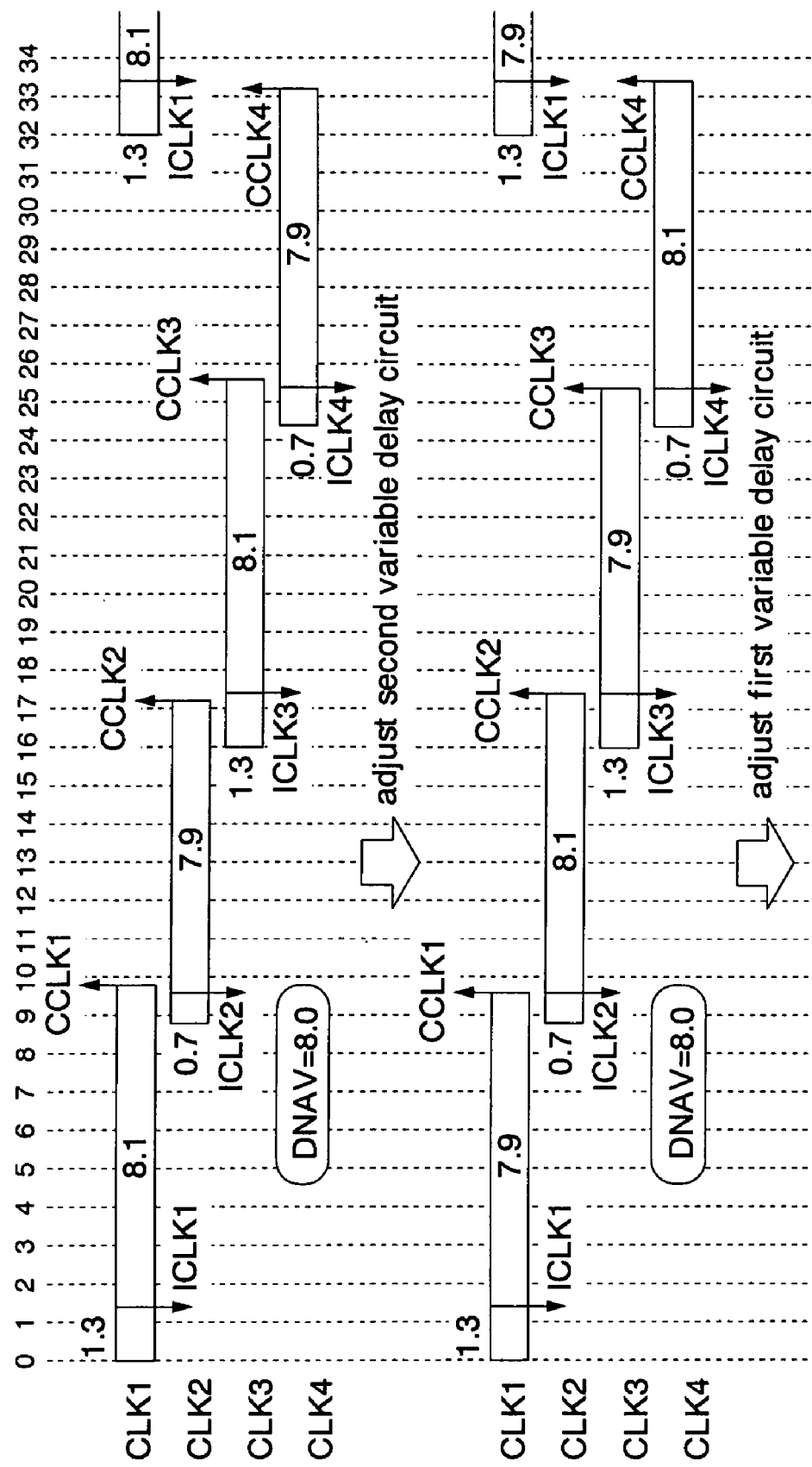
FIG. 6 is an explanatory diagram showing an overview of operation of the phase adjustment unit shown in FIG. 2.

In the upper part of FIG. 5, the first delay control circuits 14 adjust the delay times of the first variable delay circuits 10 based on the results of subtraction from the subtracters 20 as in the upper part of FIG. 4. As a result, the rising edges of the internal clocks ICLK1 to ICLK4 vary in phase, and the comparison clocks CCLK1, CCLK2, CCLK3, and CCLK4, deviate from the internal clocks ICLK2, ICLK3, ICLK4, and ICLK1 in phase. Then, the delay times of the second variable delay circuits 12 are adjusted again by the second delay control circuits 16.

In the lower part of FIG. 5, the rising edges of the comparison clocks CCLK1, CCLK2, CCLK3, and CCLK4 are adjusted in phase to the rising edges of the internal clocks ICLK2, ICLK3, ICLK4, and ICLK1, respectively, by the same procedure as described above. The differences between the delay times of the second variable delay circuits 12 and the average delay time DNAV are 0.1 unit times. The 0.1 unit times is the minimum unit of adjustment to the delay times of the first and second variable delay circuits 10 and 12. At this point, the phase comparators 18 detect a coincidence in phase, and the delay times of all the second variable delay circuits 12 coincide with the average delay time. Consequently, all the phase differences between two adjacent rising edges of the internal clocks ICLK1 to ICLK4 become equal. Subsequently, the phase adjustment unit 110 continues to operate, repeating the operations shown in the upper part of FIG. 6, the lower part of FIG. 6, and the lower part of FIG. 5. The repetition of the operations causes jitter in the internal clocks ICLK1 to ICLK4, so that jitter also occurs in the composite clock SCLK which is generated by synthesizing the internal clocks ICLK1 to ICLK4. The jitter can be reduced by making the unit of adjustment to the delay times of the first and second variable delay circuits 10 and 12 (the delay time of a single delay stage) smaller.

Figure 7:
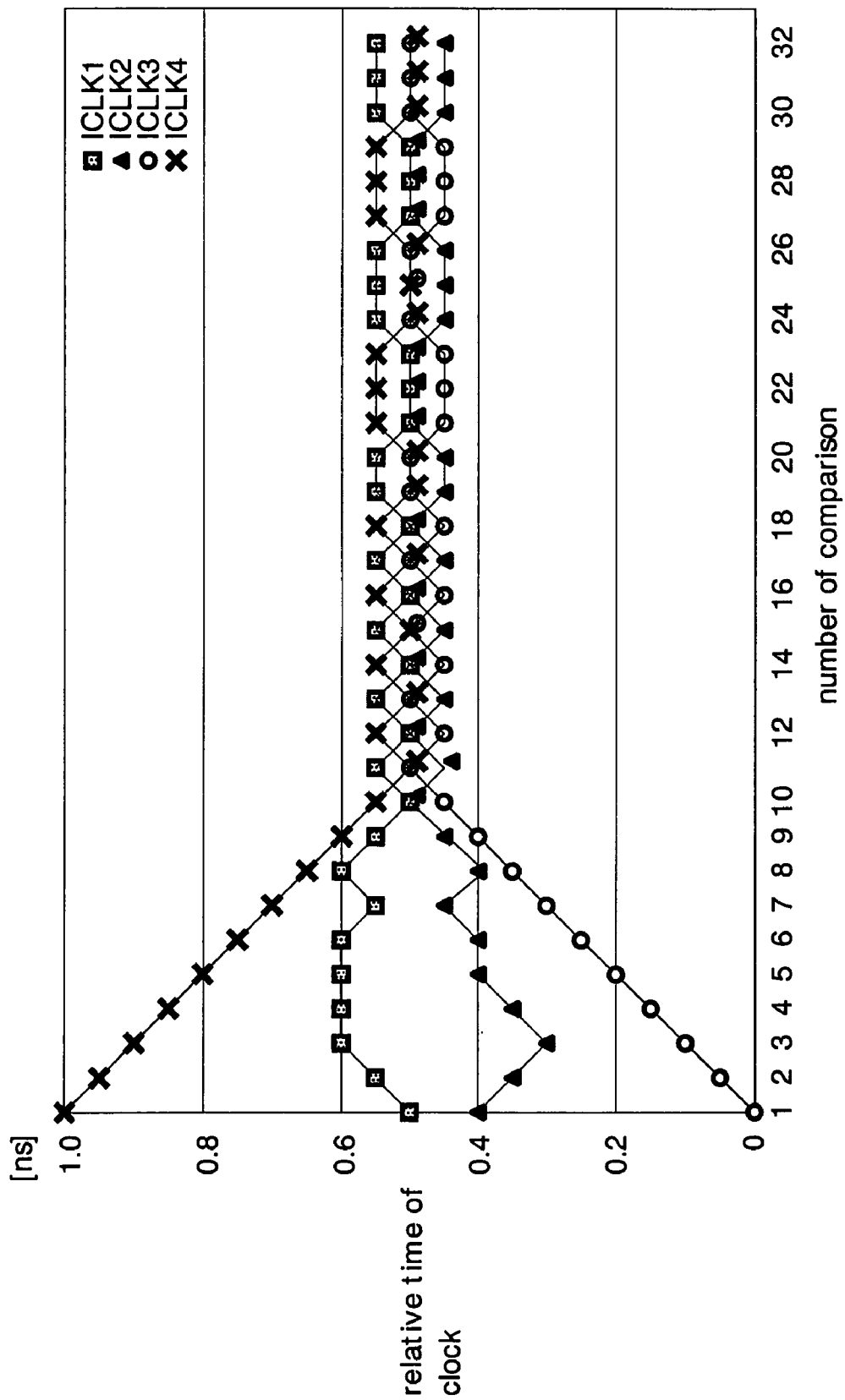
FIG. 7 is an explanatory diagram showing an overview of operation of the phase adjustment unit shown in FIG. 2.

FIG. 7 shows an overview of operation of the phase adjustment unit 110 shown in FIG. 2. In the chart, the internal clocks ICLK2 to ICLK4 are in relative positions leading by 90°, 180°, and 270° in phase with reference to the phase of the internal clock ICLK1. In this example, all the phase differences between two adjacent rising edges of the internal clocks ICLK1 to ICLK4 become equal in ten comparison operations (at the tenth cycle).

In general, even if the phase differences between the external clocks CLK1 to CLK4 output from the control unit of an LSI tester are set equally, the phase differences between the external clocks CLK1 to CLK4 input to a semiconductor integrated circuit can deviate due to loads lying in the wiring paths such as a probe card. Thus, simply determining the logic OR of the external clocks CLK1 to CLK4 to generate a composite clock of higher frequency inside the semiconductor integrated circuit cannot make all the intervals between the rising edges of the composite clock equal. Besides, when the phases of the external clocks CLK1 to CLK4 are corrected in advance according to the load such as a probe card, a detailed manual calibration is required each time the probe card is replaced. This increases the testing cost since no test can be performed during calibration.

Figure 8:
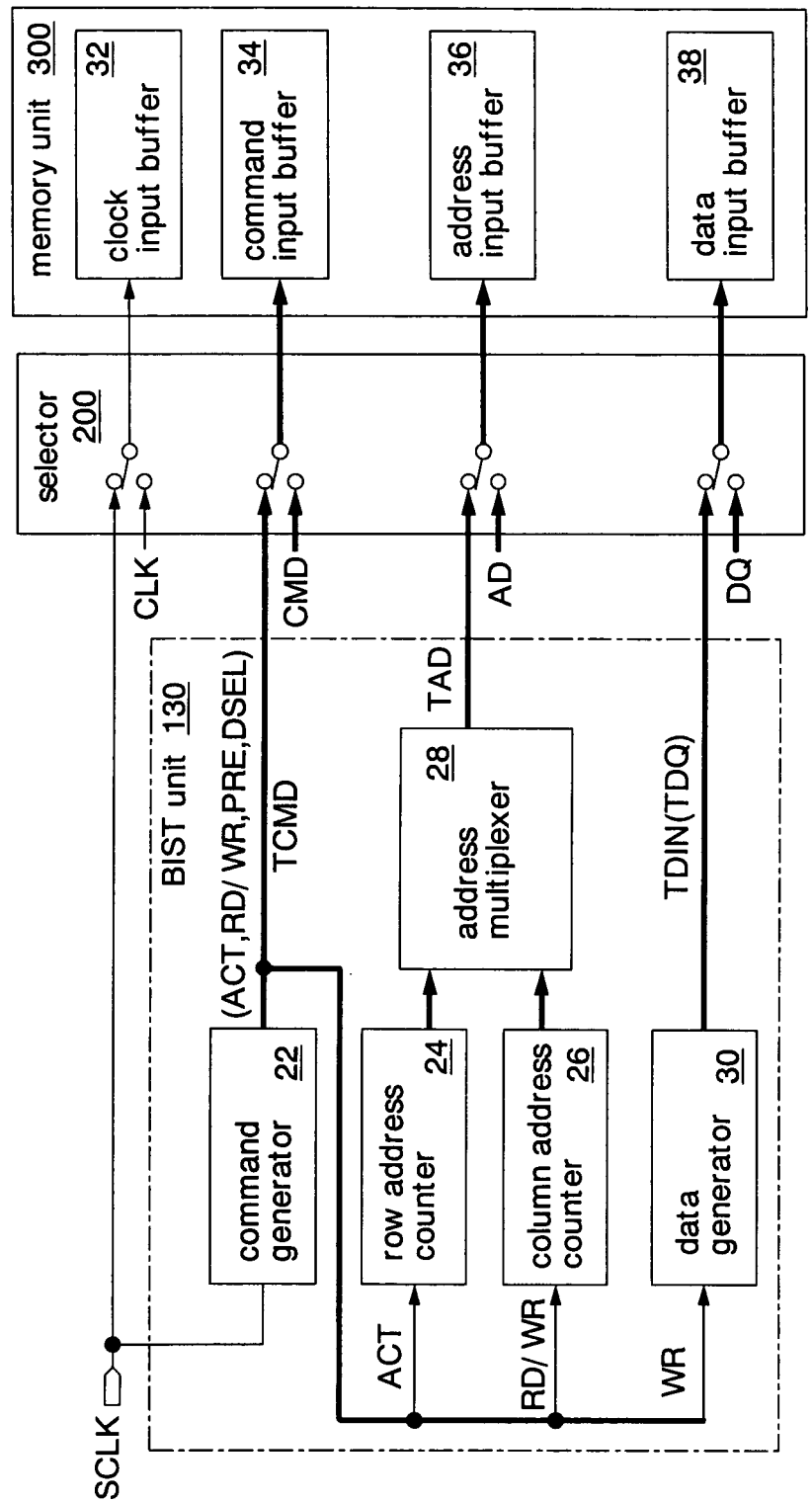
FIG. 8 is a block diagram showing the details of the BIST unit shown in FIG. 1.

FIG. 8 shows the details of the BIST unit 130 shown in FIG. 1. The BIST unit 130 includes a command generator 22, a row address counter 24, a column address counter 26, an address multiplexer 28, and a data generator 30. The command generator 22 generates an active command ACT, a read command RD (or write command WR), a precharging command PRE, and a deselect command DSEL as the commands TCMD in synchronization with four successive pulses of the composite clock SCLK, respectively.

The row address counter 24 generates a row address for selecting a word line WL in synchronization with the active command ACT. The column address counter 26 generates a column address for selecting a bit line BL in synchronization with the read command RD or the write command WR. The address multiplexer 28 outputs the row address and the column address to the common address line TAD. The data generator 30 generates test input data TDIN (TDQ) in synchronization with the write command WR. Aside from those shown in the diagram, the BIST unit 130 has a data comparator for comparing read data from the memory unit 300 with expected values for a pass/fail determination.

The composite clock SCLK, and the commands TCMD, the address TAD, and the test input data DIN output from the BIST unit 130 are supplies to a clock input buffer 32, a command input buffer 34, an address input buffer 36, and a data input buffer 38 of the memory unit 300, respectively, through the selector 200.

Figure 9:
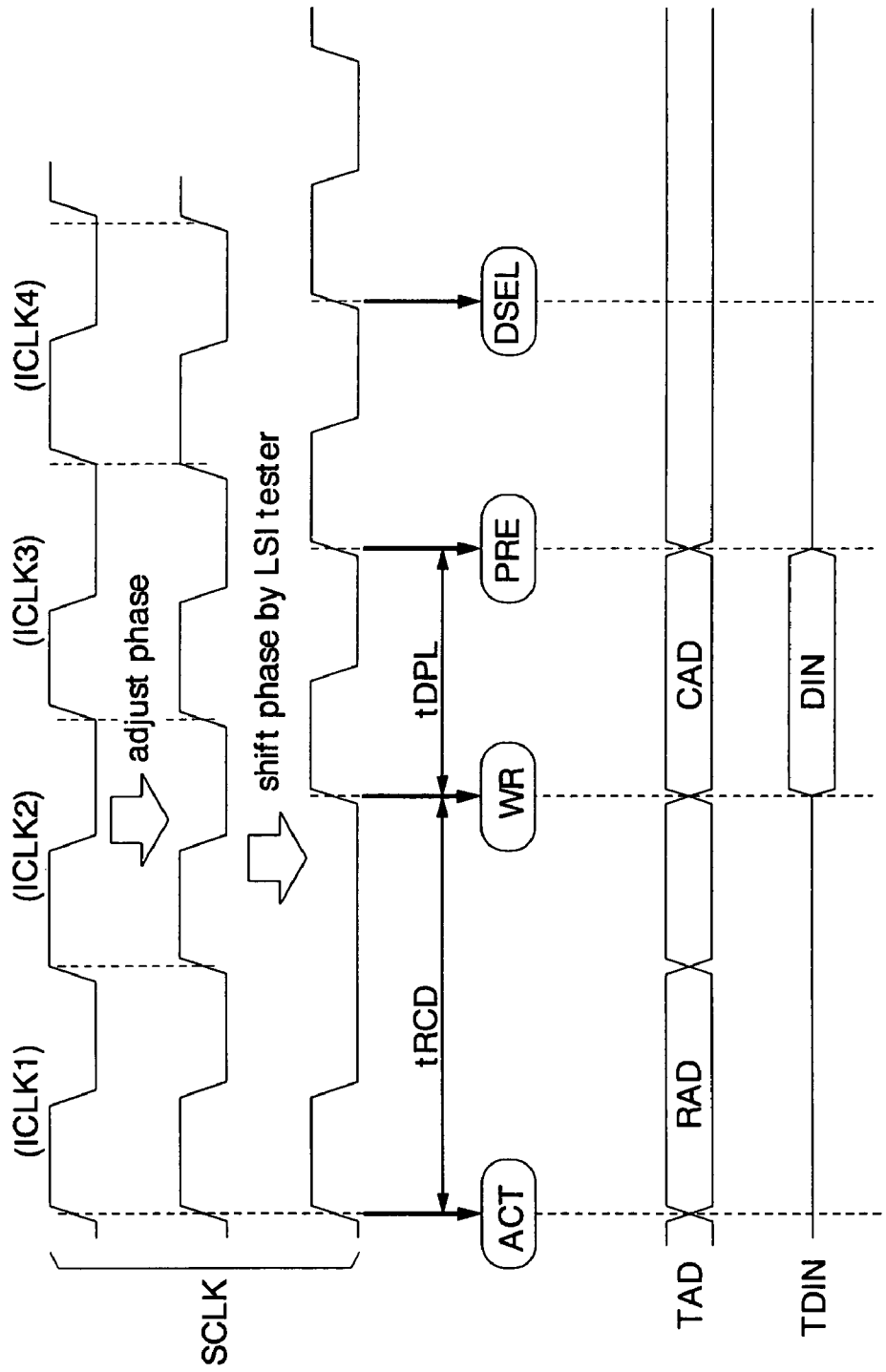
FIG. 9 is a timing chart showing en example of an SDRAM test by the testing unit shown in FIG. 1.

FIG. 9 shows en example of an SDRAM test by the testing unit 100 shown in FIG. 1. After the phase differences between the internal clocks ICLK1 to ICLK4 are set equally by the phase adjustment unit 110, the LSI tester for testing the SDRAM outputs the adjustment stop signal STOP to stop the phase adjustment operation of the phase adjustment unit 110. Next, the LSI tester delays the phases of the external clocks CLK2 to CLK4 by the time corresponding to a timing specification tRCD or tDPL. The timing specification tRCD is the minimum time to elapse from the active command ACT to the write command WR or the read command RD. The timing specification tDPL is the minimum time to elapse from the supply of write data to the precharging command PRE. The phase of the rising edge of the composite clock SCLK deviates as much as the amount of delay of the phases of the external clocks CLK2 to CLK4.

The command generator 22 of the BIST unit 130 generates the active command ACT, the write command WR, the precharging command PRE, and the deselect command DSEL successively in synchronization with the rising edges of the first to fourth pulses of the composite clock SCLK which correspond to the internal clocks ICLK1 to ICLK4, respectively. The row address counter 24 generates a row address RAD in synchronization with the active command ACT. The column address counter 26 generates a column address CAD in synchronization with the write command WR. The data generator 30 generates write data DIN in synchronization with the write command WR. Consequently, the phase differences between the internal clocks ICLK1 to ICLK4 are set equally before the phases of the external clocks CLK1 to CLK4 are changed by the LSI tester and the timing specification tRCD or tDPL is successively shifted for a test. It is therefore possible to evaluate the operation margins for these specifications accurately.

Incidentally, in this example, the setup times for the address TAD and the write data DIN are set at 0 ns with respect to the clock SCLK. If the setup times have positive values, the command generator 22 may generate a pre-active command PACT and a pre-write command PWR (or pre-read command PRD) before the generation of the active command ACT and the write command WR (or read command RD), and these commands PACT, PWR, and PRD may be supplied to the row address counter 24, the column address counter 26, and the data generator 30 shown in FIG. 8, respectively. Moreover, while FIG. 9 shows an example of the timing margin test on a write operation, a timing margin test on a read operation can also be performed in the same manner.

Figure 10:
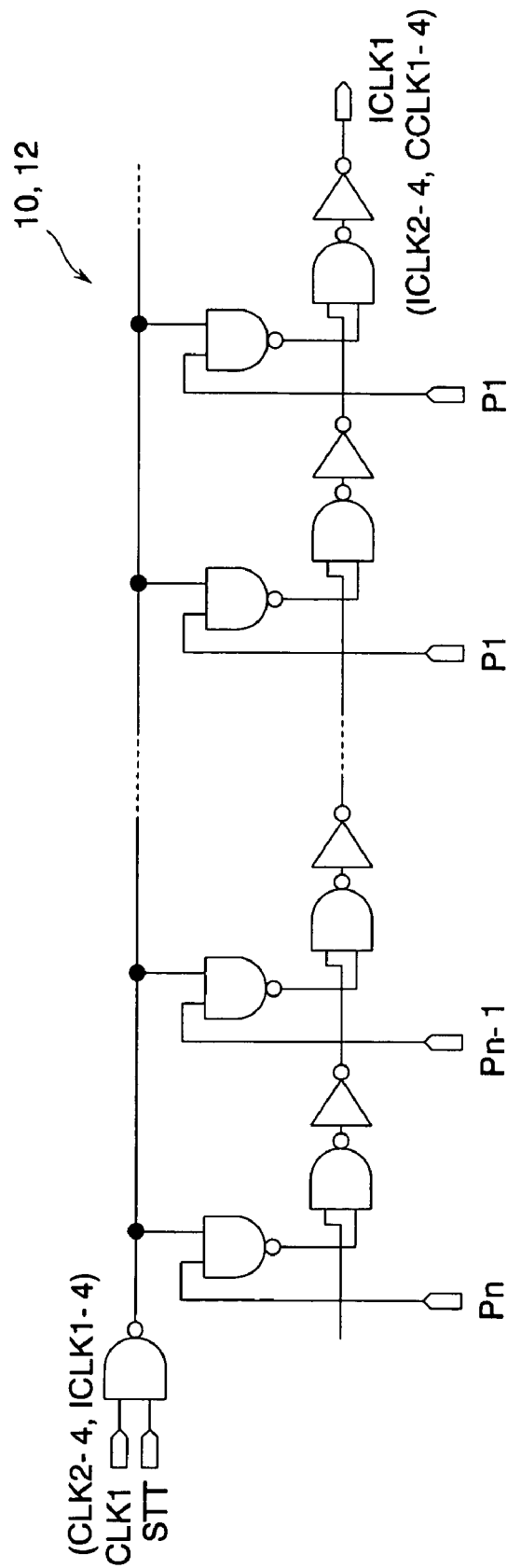
FIG. 10 is a circuit diagram showing the details of the first and second variable delay circuits shown in FIG. 2.

FIG. 10 shows the details of the first and second variable delay circuits 10 and 12 shown in FIG. 2. Since the first and second variable delay circuits 10 and 12 have the same circuit configuration, description will be given of the first variable delay circuit 10 alone. In the first variable delay circuit 10, the external clock CLK1 (or one of CLK2 to CLK4) is delayed by a predetermined time and output as the internal clock ICLK1 (or one of ICLK2 to ICLK4). In the second variable delay circuit 12, the internal clock ICLK1 (or one of ICLK2 to ICLK4) is delayed by a predetermined time and output as the comparison clock CCLK1 (or one of CCLK2 to CCLK4).

The delay time of the first variable delay circuit 10 is set by the delay control signals P1 to Pn. Any one of the delay control signals P1 to Pn is set (selected) at high level, and the others are set at low level, by the first delay control circuit 14. The delay time becomes the shortest when the delay control signal P1 is selected, and becomes the longest when the delay control signal Pn is selected. The unit of adjustment to the delay time (0.1 unit times described in FIGS. 3 to 6) is the delay time of the delay stages each consisting of a NAND gate and an inverter connected in series. A start signal STT is an enable signal of the first variable delay circuit 10. While the first variable delay circuit 10 receives the start signal STT of high level, it is activated to generate the internal clock ICLK. While the first variable delay circuit 10 receives the start signal STT of low level, it is inactivated to stop operating. For example, the start signal STT is kept at high level in test mode, and kept at low level in normal operation mode. The first and second variable delay circuits 10 and 12 make no operation in normal operation mode, with a reduction in power consumption.

Figure 11:
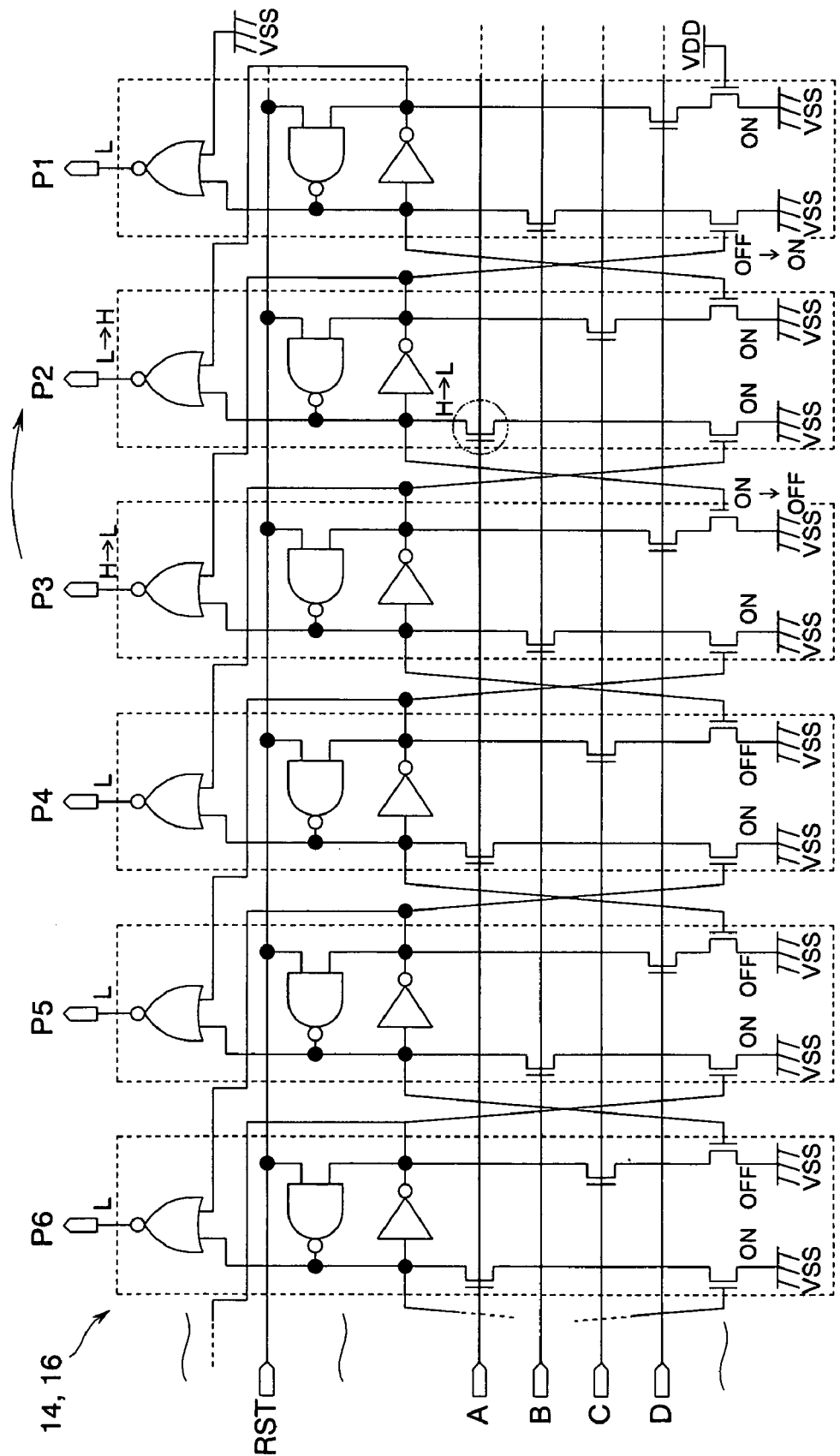
FIG. 11 is a circuit diagram showing the details of the first and second delay control circuits shown in FIG. 2.

FIG. 11 shows the details of the first and second delay control circuits 14 and 16 shown in FIG. 2. Since the first and second delay control circuits 14 and 16 have the same circuit configuration, description will be given of the first delay control circuit 14 alone. The first delay control circuit 14 has control stages (broken-lined frames in the diagram) corresponding to the delay control signals P1 to Pn, respectively. Each of the control stages has a latch consisting of a NAND gate and an inverter, a pair of nMOS transistors for connecting the complementary nodes of the latch to a ground line VSS, and a NOR gate for outputting one of the delay control signals P1 to Pn. Each control stage receives the control signals A and C, or the control signals B and D, at the gates of the nMOS transistors.

In the first delay control circuit 14, a control stage selected by the control signals A to D exclusively outputs a delay control signal of high level (one of P1 to Pn). The control stage to be selected shifts to the right in the diagram when either of the high level pulses of the control signals A and B is received, and shifts to the left in the diagram when either of the high level pulses of the control signals C and D is received. For example, when the control stage corresponding to the delay control signal P3 is selected, the control stage corresponding to the delay control signal P2 is selected in response to the pulse of the control signal A. That is, the delay control signal P3 changes from high level to low level, and the delay control signal P2 changes from low level to high level. The first delay control circuit 14 is reset in response to a reset signal RST, whereby the delay control signal P1 alone is set at high level and the other delay control signals P2 to Pn are set at low level.

Figure 12:
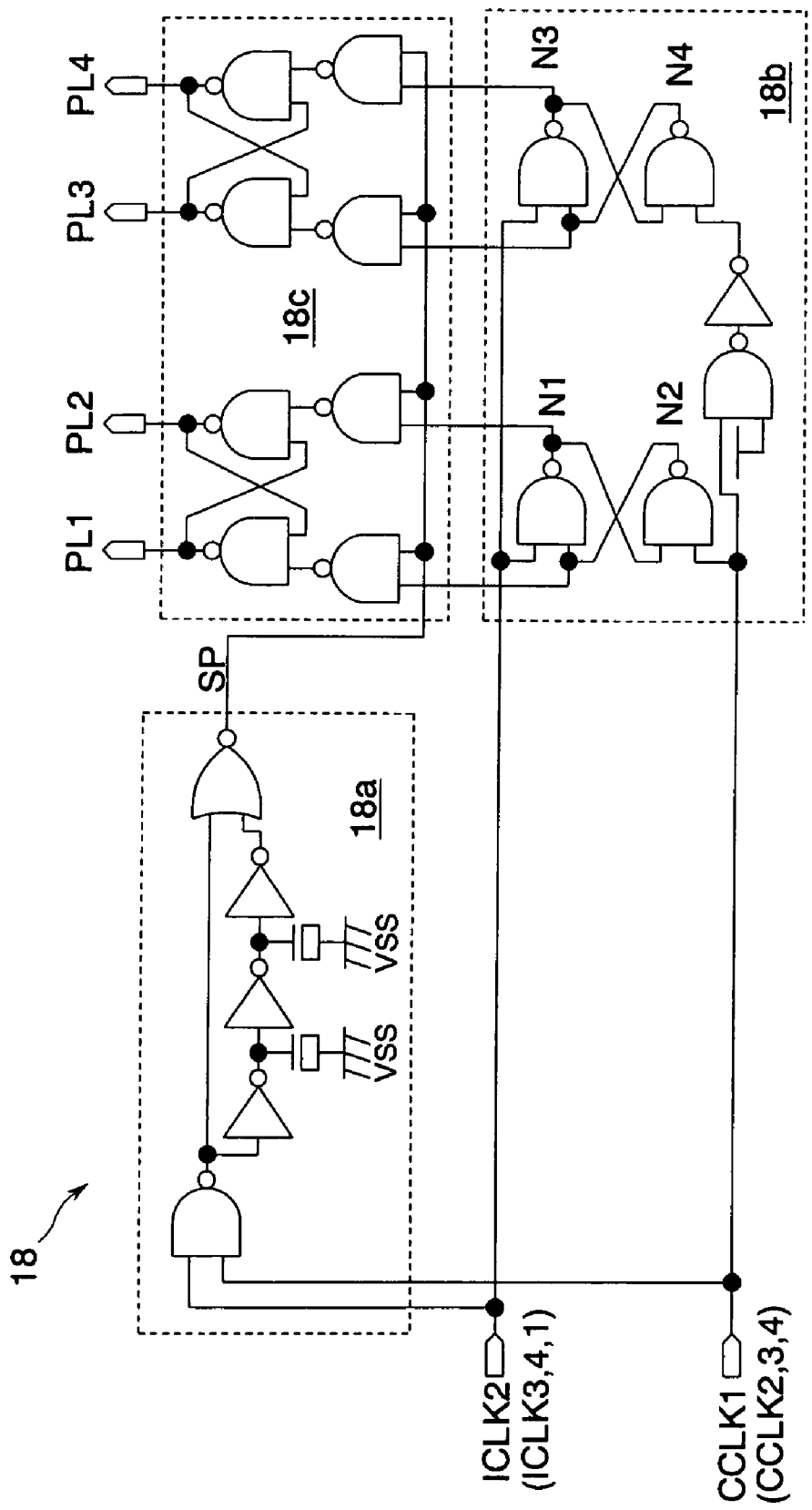
FIG. 12 is a circuit diagram showing the details of the phase comparator shown in FIG. 2.
Figure 13:
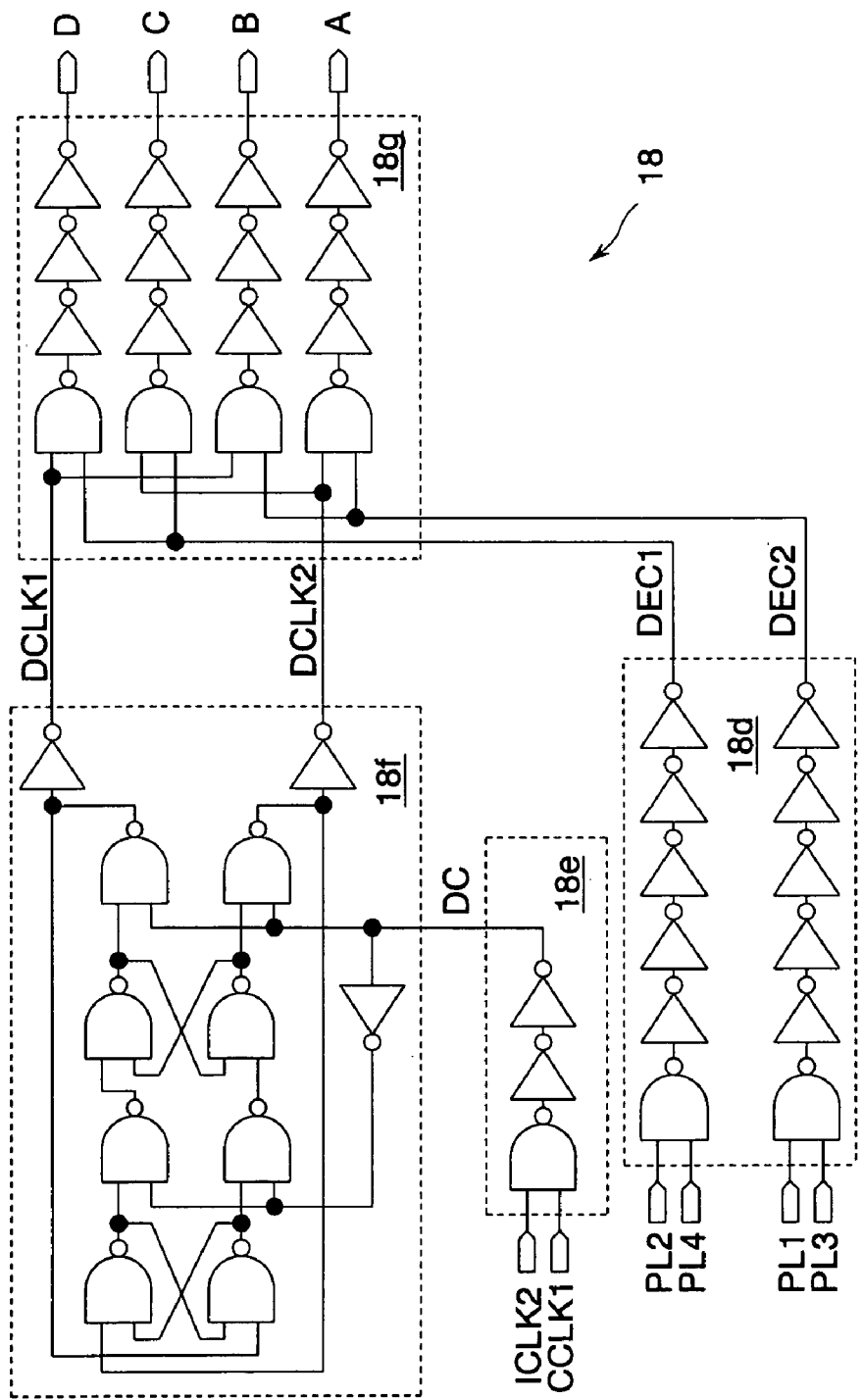
FIG. 13 is a circuit diagram showing the details of the phase comparator shown in FIG. 2.

FIGS. 12 and 13 show the details of the phase comparator 18 shown in FIG. 2. In FIG. 12, the phase comparator 18 has a sampling pulse generating unit 18a, a phase detecting unit 18b, and a latch unit 18c. The sampling pulse generating unit 18a generates a sampling pulse SP synchronously when the comparison clock CCLK1 (or one of CCLK2 to CCLK4) and the internal clock ICLK2 (or one of ICLK3, ICLK4, and ICLK1) both change to high level.

The phase detecting unit 18b has two flip-flops connected in series, and a delay stage arranged between the flip-flops. The delay stage is the same circuit as the delay stages of the second variable delay circuit 12 shown in FIG. 10. The positional relationship in phase between the comparison clock CCLK1 and the internal clock ICLK2 is expressed by outputs N1 to N4 of the two two-input NAND gates constituting the respective flip-flops. The latch unit 18c latches the four output signals of the phase detecting unit 18b in synchronization with the sampling pulse SP, and outputs them as phase latch signals PL1 to PL4.

When the comparison clock CCLK1 leads the internal clock ICLK2 in phase, the phase latch signals PL1 to PL4 change to L, H, L, and H (L represents low level, and H represents high level). When the comparison clock CCLK1 lags behind the internal clock ICLK2 in phase, the phase latch signals PL1 to PL4 change to H, L, H, and L. When the comparison clock CCLK1 coincides with the internal clock ICLK2 in phase (more specifically, when the phase difference is smaller than the delay time of a single delay stage of the second variable delay circuit 12), the phase latch signals PL1 to PL4 change to L, H, H, and L.

In FIG. 13, the phase comparator 18 has a decoding unit 18d, a pulse generating unit 18e, a frequency divider 18f, and an output unit 18g. The decoding unit 18d decodes the phase latch signals PL1 to PL4, and outputs decoded signals DEC1 and DEC2. When the comparison clock CCLK1 leads the internal clock ICLK2 in phase, the decoded signals DEC1 and DEC2 change to H and L. When the comparison clock CCLK1 lags behind the internal clock ICLK2 in phase, the decoded signals DEC1 and DEC2 change to L and H. When the comparison clock CCLK1 coincides with the internal clock ICLK2 in phase, the decoded signals DEC1 and DEC2 change to L and L.

The pulse generating unit 18e detects the high level periods of the comparison clock CCLK1 and the internal clock ICLK2, and generates a detection clock DC. The frequency divider 18f divides the frequency of the detection clock DC by half to generate divided clocks DCLK1 and DCLK2 whose high level periods do not overlap each other. The output unit 18g outputs the control signals A, B, C, and D in accordance with the logic of the decoded signals DEC1 and DEC2.

Figure 14:
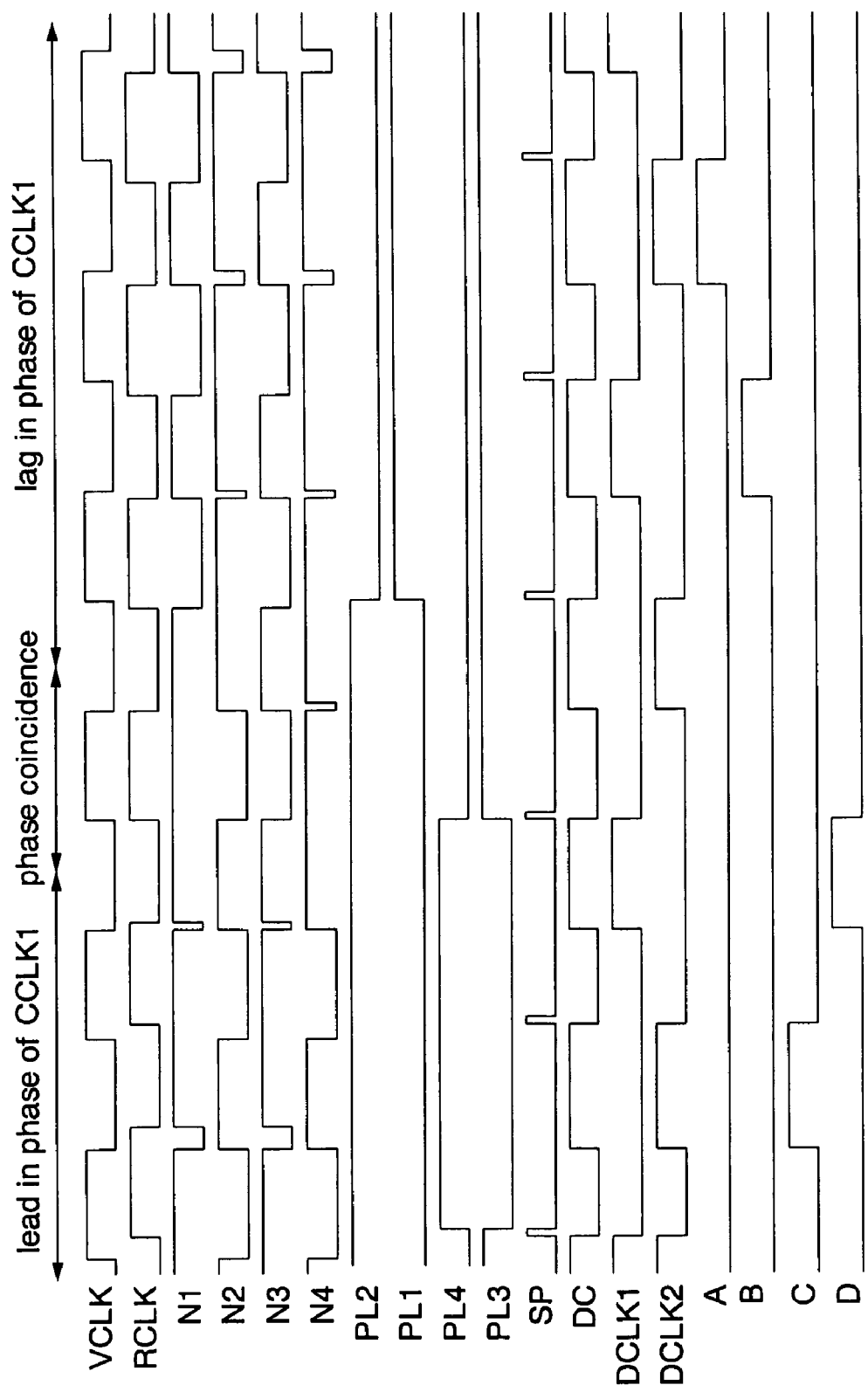
FIG. 14 is a timing chart showing the operation of the phase comparator shown in FIG. 2.

FIG. 14 shows the operation of the phase comparator 18 shown in FIG. 2. This example deals with the case of comparing the comparison clock CCLK1 with the internal clock ICLK2 in phase. The operations for comparing the comparison clocks CCLK2, CCLK3, and CCLK4 with the internal clocks ICLK3, ICLK4, and ICLK1 in phase are the same as in FIG. 14. When the comparison clock CCLK1 leads the internal clock ICLK2 in phase, the phase comparator 18 outputs the control signals C and D in synchronization with the high level pulses of the divided clocks DCLK2 and DCLK1, respectively. When the comparison clock CCLK1 coincides with the internal clock ICLK2 in phase, none of the control signals A to D is output. When the comparison clock CCLK1 lags behind the internal clock ICLK2 in phase, the phase comparator 18 outputs the control signals A and B in synchronization with the high level pulses of the divided clocks DCLK2 and DCLK1, respectively.

As above, in the first embodiment, the phase adjustment unit 110 can make all the phase differences between the adjacent internal clocks ICLK1 to ICLK4 equal so that all the pulse intervals of the composite clock SCLK are equal. It is therefore possible to operate the SDRAM at high speed by using the external clocks CLK1 to CLK4 of lower frequencies. For example, the memory unit 300 can be operated and tested at high speed by using a low-cost LSI tester having a low clock frequency. As a result, it is possible to reduce the testing cost of the SDRAM, allowing a reduction in chip cost.

Since the phase adjustment unit 110 is entirely made of digital circuits, it is possible to reduce the circuit scale for simpler configuration.

The adjustments to the delay times of the first variable delay circuits 10 by the first delay control circuits 1 are performed after the delay times of the second variable delay circuits are adjusted and the phase comparators detect a coincidence in phase. This can preclude the first and second variable delay circuits 14 and 16 from making adjustment operations simultaneously. It is therefore possible to prevent jitter from occurring in the internal clocks ICLK1 to ICLK4 due to simultaneous phase adjustments.

In the phase adjustment unit 110, the first delay control circuits 14 of the four sub phase adjustment units 140 operate simultaneously, adjusting the delay times of the first variable delay circuits 10. Similarly, the second delay control circuits 16 operate simultaneously, adjusting the delay times of the second variable delay circuits 12. This can reduce the time for the internal clocks ICLK1 to ICLK4 to coincide in phase with one another.

The adjustment operation on the phases of the internal clocks ICLK1 to ICLK4 can be stopped in response to the adjustment stop signal STOP which is supplied from the LSI tester. Consequently, after the phase adjustment operation is stopped, the phases of the internal clocks ICLK1 to ICLK4 can be changed to desired values by changing the phases of the external clocks CLK1 to CLK4 from the LSI tester. It is therefore possible to evaluate the timing specifications tRCD, tDPL, and the like in detail by such means as a probe test on the SDRAM. Since detailed timing tests can be effected by probe tests, SDRAM chips having predetermined operation margins can be sealed into a package. Thus, for example, when SDRAM chips and other chips are laminated into a package to manufacture SIPs, it is possible to improve the SIP yield and reduce the product cost.

The testing unit 100 is provided with the BIST unit 130 which generates the commands TCMD, the address TAD, and the data TDQ in synchronization with the composite clock SCLK. This makes it possible to perform high speed operation tests on the SDRAM with the external clocks CLK1 to CLK4 of lower frequencies alone. Moreover, the formation of the BIST unit 130 on the SDRAM can reduce the number of terminals to be used by the LSI tester. A greater number of SDRAMs can thus be tested at a time. This consequently allows a reduction in testing cost.

The phase adjustment unit 110 is activated by the test signal TEST in test mode alone, generating the internal clocks ICLK1 to ICLK4. Since the phase adjustment unit 110 makes no operation in normal operation mode, it is possible to reduce the power consumption in normal operation mode.

Figure 15:
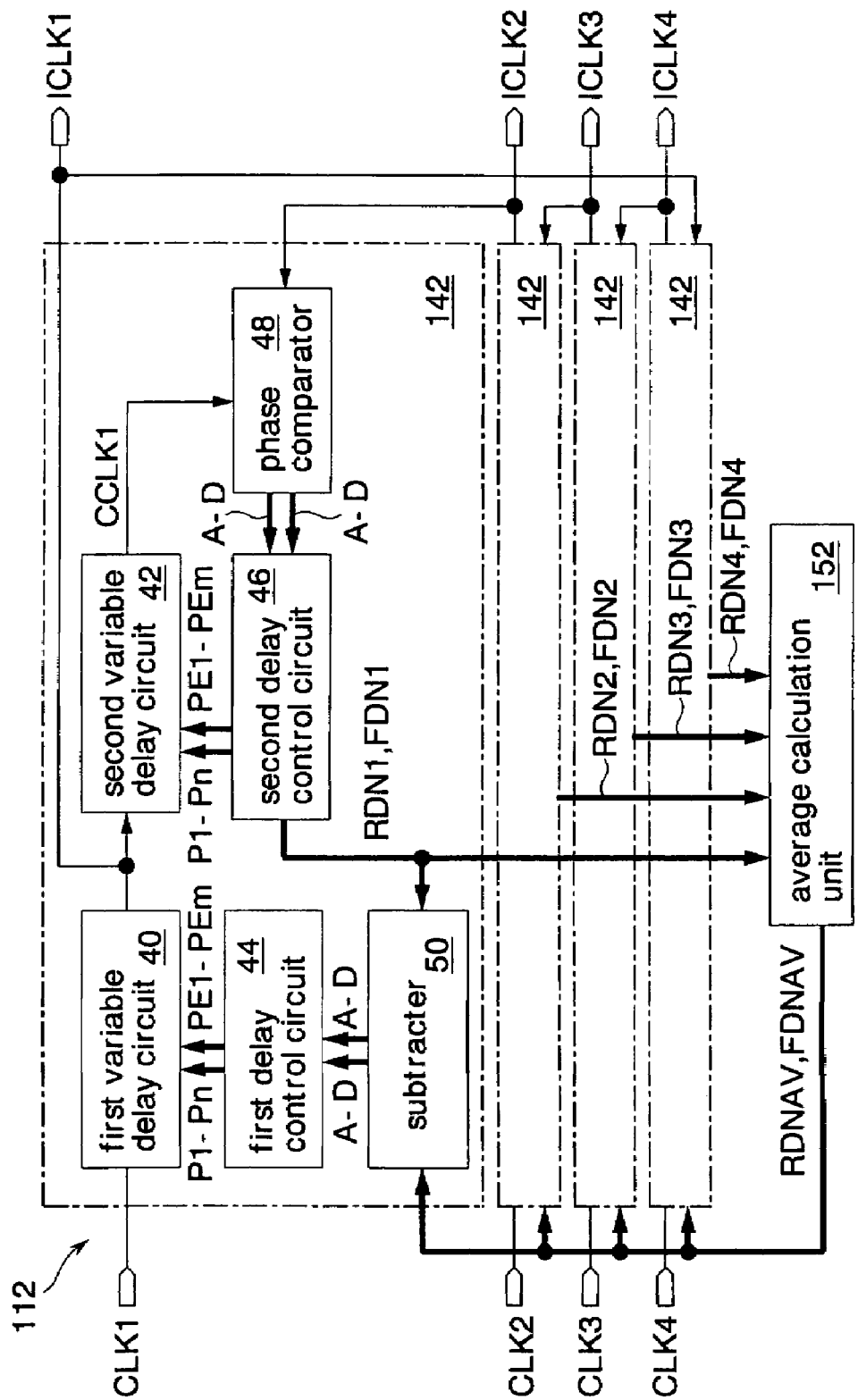
FIG. 15 is a block diagram showing the phase adjustment unit according to a second embodiment of the semiconductor integrated circuit of the present invention.

FIG. 15 shows the phase adjustment unit according to a second embodiment of the semiconductor integrated circuit of the present invention. As in the first embodiment, this semiconductor integrated circuit is formed on a silicon substrate by using CMOS processes, as a clock synchronous SDRAM. The SDRAM has a phase adjustment unit 112 instead of the phase adjustment unit 110 of the first embodiment. The rest of the configuration is the same as in the first embodiment. Incidentally, the same elements as those described in the first embodiment will be designated by identical reference numbers or symbols. Detailed description thereof will be omitted.

The phase adjustment unit 112 has sub phase adjustment units 142 corresponding to the external clocks CLK1 to CLK4, respectively, and an average calculation unit 152. Since all the sub phase adjustment units 142 have the same circuit configuration, the following description will deal only with the sub phase adjustment unit 142 that receives the external clock CLK1. The sub phase adjustment units 142 each have a first variable delay circuit 40, a second variable delay circuit 42, a first delay control circuit 44, a second delay control circuit 46, a phase comparator 48, and a subtracter 50.

Figure 16:
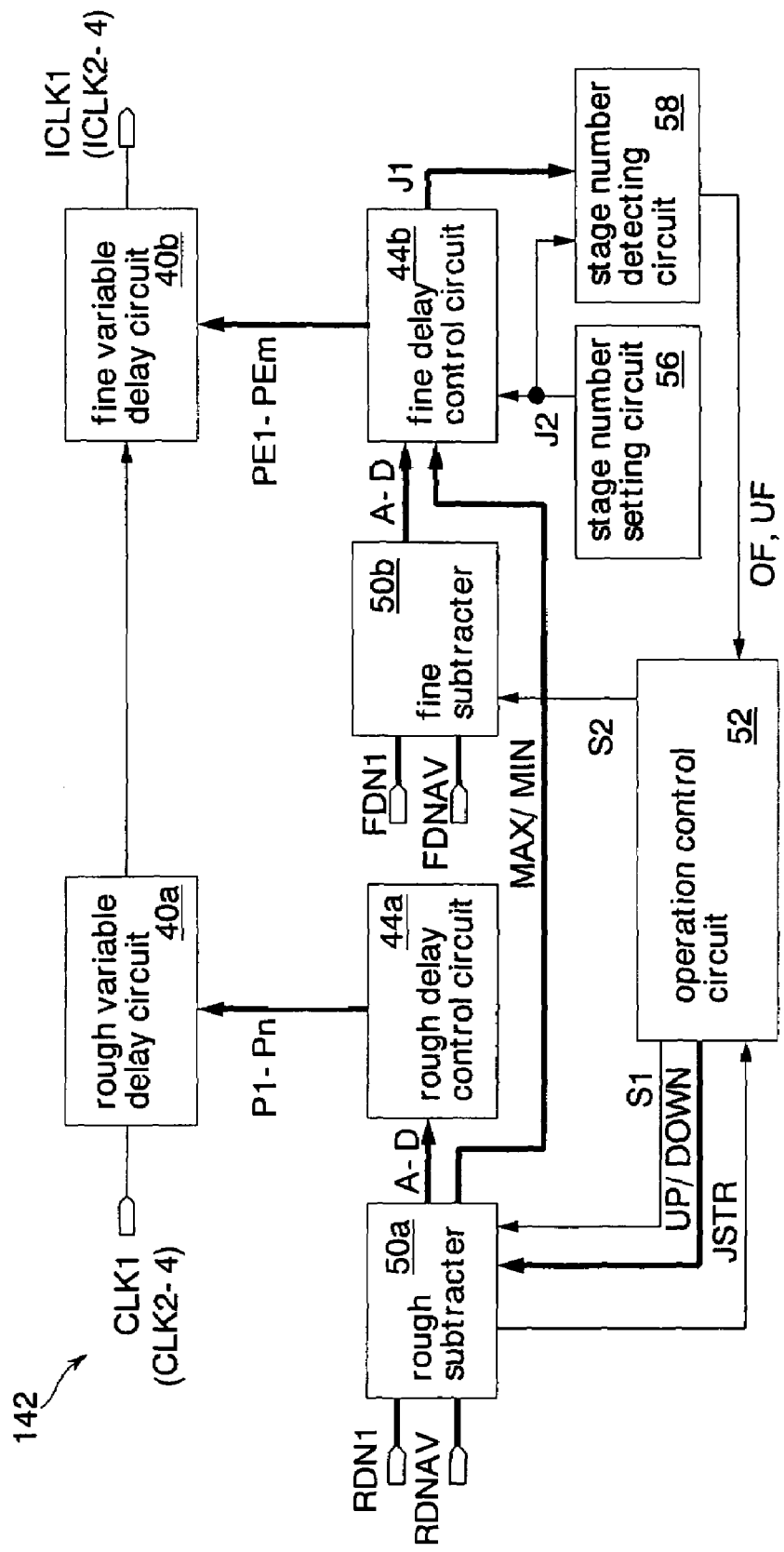
FIG. 16 is a block diagram showing the details of the first variable delay circuit and related elements in the sub phase adjustment unit shown in FIG. 15.
Figure 17:
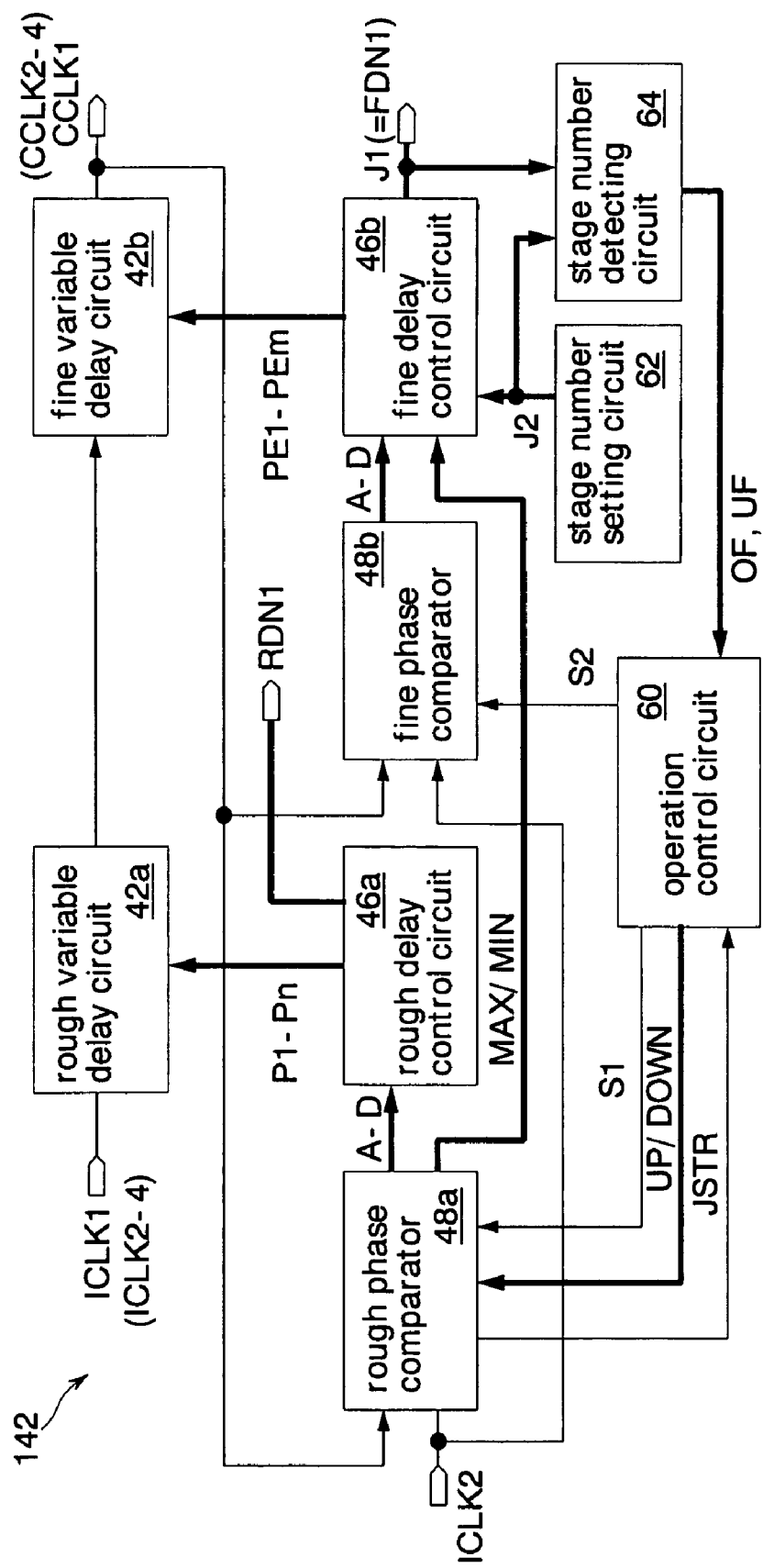
FIG. 17 is a block diagram showing the details of the second variable delay circuit and related elements in the sub phase adjustment unit shown in FIG. 15.

In this embodiment, the first variable delay circuit 40 is composed of a rough variable delay circuit 40a and a fine variable delay circuit 40b as shown in FIG. 16. The second variable delay circuit 42 is composed of a rough variable delay circuit 42a and a fine variable delay circuit 42b as shown in FIG. 17. The first and second delay control circuits 44 and 46 then output rough and fine, two systems of delay control signals P1 to Pn and PE1 to PEn. The second delay control circuit 46 also outputs rough and fine, two systems of delay stage numbers RDN1 and FDN1. The phase comparator 48 and the subtracter 50 output rough and fine, two systems of control signals A to D. The average calculation unit 152 outputs rough and fine, two systems of average delay stage numbers RDNAV and FDNAV.

FIG. 16 shows the details of the first variable delay circuit 40 and related elements in the sub phase adjustment units 142 shown in FIG. 15. The first variable delay circuit 40 shown in FIG. 15 is composed of the rough variable delay circuit 40a and the fine variable delay circuit 40b which are connected in series. Similarly, the first delay control circuit 44 is composed of a rough delay control circuit 44a and a fine delay control circuit 44b. The subtracter 50 is composed of a rough subtracter 50a and a fine subtracter 50b. The external clock CLK1 (or CLK2 to CLK4) is supplied to the rough variable delay circuit 40a, and the internal clock ICLK1 (or ICLK2 to ICLK4) is output from the fine variable delay circuit 40b. The unit of adjustment to the delay time of the fine variable delay circuit 40b is smaller than that to the delay time of the rough variable delay circuit 40a (for example, $1/10$). Thus, in the sub phase adjustment unit 142, the delay time of the rough variable delay circuit 40a is adjusted until the calculation at the rough subtracter 50a reaches zero. Then, the delay time of the fine variable delay circuit 40b is adjusted until the calculation at the fine subtracter 50b reaches zero.

The rough variable delay circuit 40a is the same circuit as the variable delay circuit of the first embodiment. The fine variable delay circuit 40b will be detailed in FIG. 20 to be seen later. The rough subtracter 50a is the same circuit as the subtracter 20 of the first embodiment except in that: it receives an up signal UP and a down signal DOWN to increase and decrease the delay time of the rough variable delay signal 40a by a single stage; it outputs a minimum signal MIN and a maximum signal MAX in response to the up signal UP and the down signal DOWN, respectively; and it is activated to operate by an enable signal S1. The fine subtracter 50b is the same circuit as the subtracter 20 of the first embodiment.

The rough delay control circuit 44a is the same circuit as the first delay control circuit 14 of the first embodiment. The fine delay control circuit 44b increases the number of high-level signals among the delay adjustment signals PE1 to PEm when it increases the delay time of the fine variable delay circuit 40b. When it decreases the delay time of the fine variable delay circuit 40b, the fine delay control circuit 44b decreases the number of high-level signals among the delay adjustment signals PE1 to PEm. The fine delay control circuit 44b will be detailed in FIG. 25 to be seen later.

Aside from the circuits mentioned above, the sub phase adjustment unit 142 has an operation control circuit 52, a stage number setting circuit 56, and a stage number detecting circuit 58. In starting to adjust the delay time, the operation control circuit 52 sets the enable signals S1 and S2 at high level and low level in order to start the operation of the rough subtracter 50a and stop the operation of the fine subtracter 50b. When the operation control circuit 52 receives a lock-on signal JSTR from the rough subtracter 50a, it sets the enable signals S1 and S2 at low level and high level in order to stop the operation of the rough subtracter 50a and start the operation of the fine subtracter 50b. Besides, when the operation control circuit 52 receives an overflow signal OF from the stage number detecting circuit 58, it outputs the up signal UP in order to increase the delay time of the rough variable delay circuit 40a by a unit delay time (equivalent to a single delay stage). When the operation control circuit 52 receives an underflow signal UF from the stage number detecting circuit 58, it outputs the down signal DOWN in order to decrease the delay time of the rough variable delay circuit 40a by the unit time (equivalent to a single delay stage).

The stage number setting circuit 56 operates, for example, at the time of power-on resetting. It detects how many delay stages of the fine variable delay circuit 40*b* the delay time of a single stage of the rough variable delay circuit 40*a* corresponds to, and outputs the result as a delay stage number J2 of the fine variable delay circuit 40*b* at that point. The stage number detecting circuit 58 outputs the overflow signal OF when the current delay stage number J1 of the fine variable delay circuit 40*b* exceeds the delay stage number J2. The stage number detecting circuit 58 outputs the underflow signal UF when the current delay stage number J1 of the fine variable delay circuit 40*b* falls below a minimum stage number. Incidentally, when the current delay stage number of the fine variable delay circuit 40*b* exceeds the delay stage number J2, the fine delay control circuit 44*b* changes the delay stage number of the fine variable delay circuit 40*b* to a minimum value. When the current delay stage number of the fine variable delay circuit 40*b* falls below the minimum stage number, the fine delay control circuit 44*b* changes the delay stage number of the fine variable delay circuit 40*b* to the maximum value J2.

FIG. 17 shows the details of the second variable delay circuit 42 and related elements in the sub phase adjustment units 142 shown in FIG. 15. Detailed description will be omitted of the same elements as in FIG. 16 seen above. The second variable delay circuit 42 shown in FIG. 15 is composed of the rough variable delay circuit 42*a* and the fine variable delay circuit 42*b* which are connected in series. The first delay control circuit 46 is composed of a rough delay control circuit 46*a* and a fine delay control circuit 46*b*. The phase comparator 48 is composed of a rough phase comparator 48*a* and a fine phase comparator 48*b*. The internal clock ICLK1 (or ICLK2 to ICLK4) is supplied to the rough variable delay circuit 42*a*, and the comparison clock CCLK1 (or CCLK2 to ICLK4) is output from the fine variable delay circuit 42*b*. The unit of adjustment to the delay time of the fine variable delay circuit 42*b* is smaller than that of the delay time of the rough variable delay circuit 42*a* (for example, ⅒). Consequently, in the sub phase adjustment unit 142, the delay time of the rough variable delay circuit 42*a* is adjusted until the rough phase comparator 48*a* detects a coincidence in phase. Then, the delay time of the fine variable delay circuit 42*b* is adjusted until the fine phase comparator 48*b* detects a coincidence in phase.

The rough variable delay circuit 42*a* and the fine variable delay circuit 42*b* are the same circuits as the rough variable delay circuit 40*a* and the fine variable delay circuit 40*b* shown in FIG. 16. The rough delay control circuit 46*a* and the fine delay control circuit 46*b* are the same circuits as the rough delay control circuit 44*a* and the fine delay control circuit 44*b* shown in FIG. 16.

The rough phase comparator 48*a* is the same circuit as the phase comparator 18 of the first embodiment except in that: it receives an up signal UP and a down signal DOWN to increase and decrease the delay time of the rough variable delay signal 42*a* by a single stage; it outputs a minimum signal MIN and a maximum signal MAX in response to the up signal UP and the down signal DOWN, respectively; and it is activated to operate by an enable signal S1. The fine phase comparator 48*b* is the same circuit as the phase comparator 18 of the first embodiment except in that it is activated to operate by the enable signal S2. The operation control circuit 60, the stage number setting circuit 62, and the stage number detecting circuit 64 are the same as the operation control circuit 52, the stage number setting circuit 54, and the stage number detecting circuit 56 shown in FIG. 16.

Figure 18:
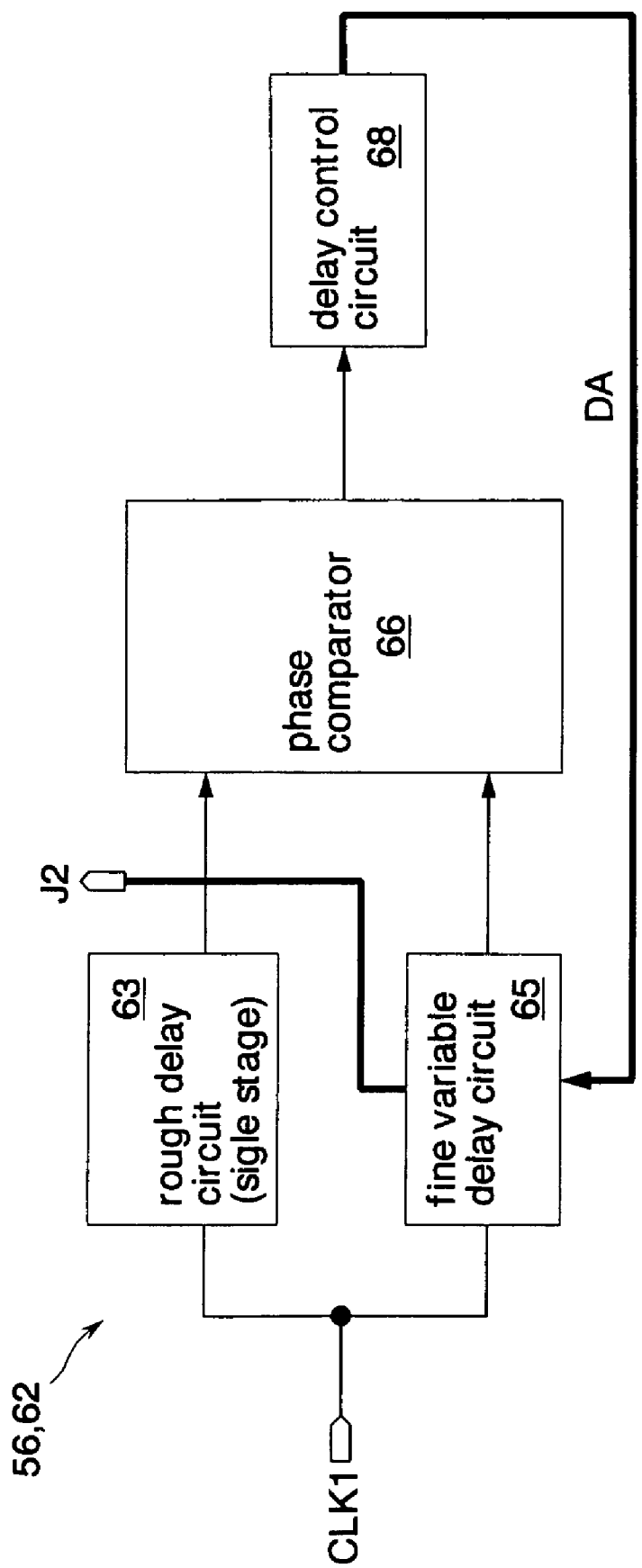
FIG. 18 is a block diagram showing the details of the stage number setting circuits shown in FIGS. 16 and 17.

FIG. 18 shows the details of the stage number setting circuits 56 and 62 shown in FIGS. 16 and 17. Since the stage number setting circuits 56 and 62 are the same circuits, the following description will deal with the stage number setting circuit 56 alone. The stage number setting circuit 56 has a rough delay circuit 63, a fine variable delay circuit 65 having the same configuration as that of the fine variable delay circuits 40*b* and 42*b*, a phase comparator 66, and a delay control circuit 68.

The rough delay circuit 63 has a circuit equivalent to a single delay stage of the rough variable delay circuits 40*a* and 42*a*. That is, the delay time of the rough delay circuit 63 is set at the unit time of the rough variable delay circuits 40*a* and 42*a*. The phase comparator 66 compares the phases of signals that are obtained by delaying the external clock CLK1 in the rough delay circuit 63 and the fine variable delay circuit 65. The delay control circuit 68 outputs a delay adjustment signal DA for adjusting the delay time of the fine variable delay circuit 65 so that the result of comparison in the phase comparator 66 shows a coincidence. Then, the stage number J2 of the fine variable delay circuit 65 corresponding to the delay time of a single delay stage of the rough variable delay circuits 40*a* and 42*a* is detected and output from the fine variable delay circuit 65.

Figure 19:
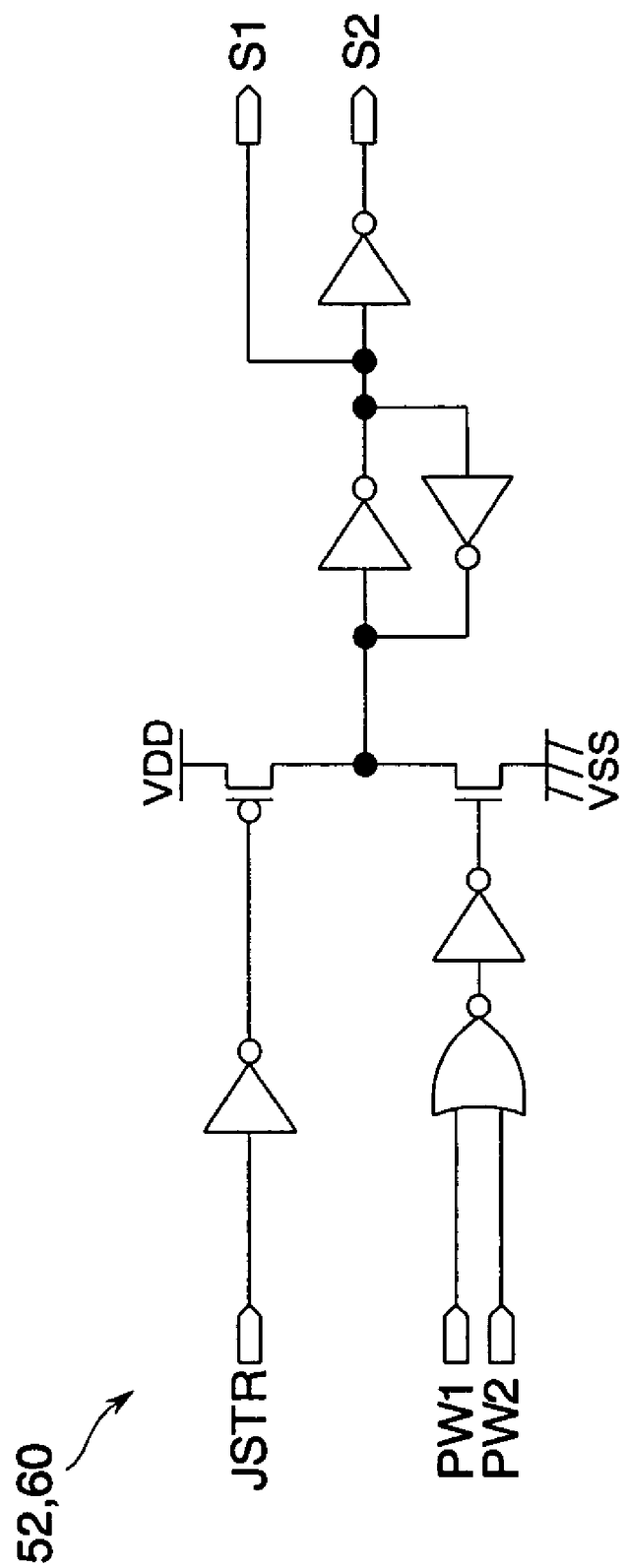
FIG. 19 is a circuit diagram showing essential parts of the operation control circuits shown in FIGS. 16 and 17.

FIG. 19 shows essential parts of the operation control circuits 52 and 60 shown in FIGS. 16 and 17. Since the operation control circuits 52 and 60 are the same circuits, the following description will deal with the operation control circuit 52 alone. The operation control circuit 52 sets the enable signals S1 and S2 to high level and low level, respectively, in synchronization with a power-on resetting signal PW1 or a power-down return signal PW2. The operation control circuit 52 sets the enable signals S1 and S2 to low level and high level, respectively, in synchronization with the lock-on signal JSTR.

Figure 20:
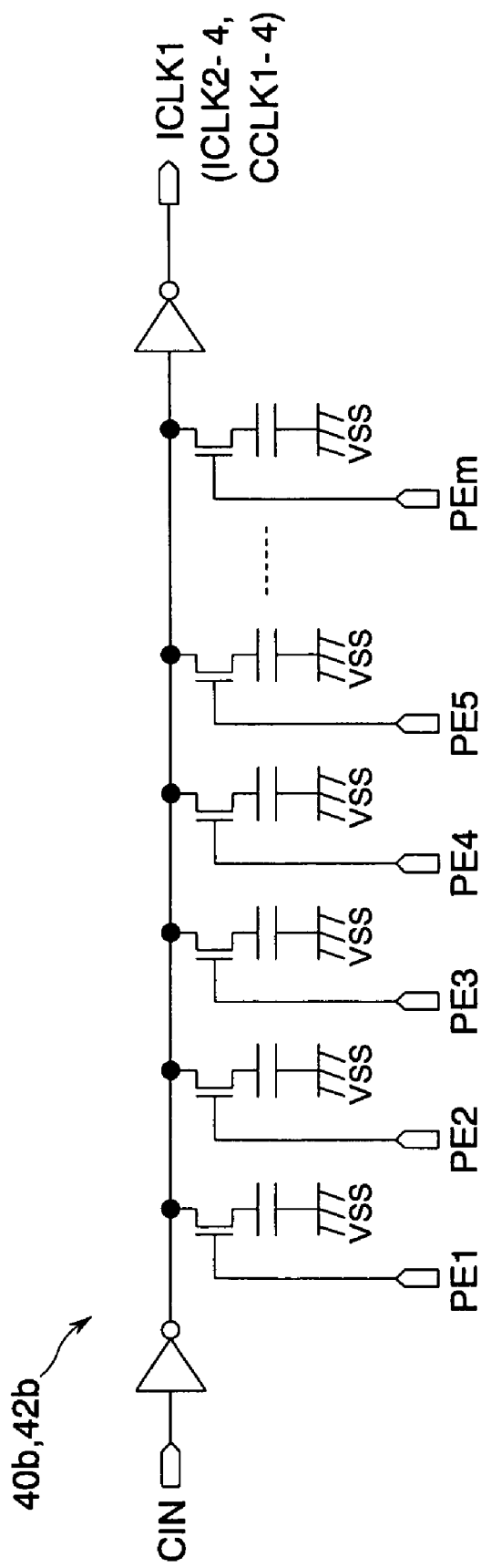
FIG. 20 is a circuit diagram showing the details of the fine variable delay circuits shown in FIGS. 16 and 17.

FIG. 20 shows the details of the fine variable delay circuits 40*b* and 42*b* shown in FIGS. 16 and 17. Since the fine variable delay circuits 40*b* and 42*b* are the same circuits, the following description will deal with the fine variable delay circuit 40*b* alone. The fine variable delay circuit 40*b* has two inverters connected in series between an input node CIN and an output node (ICLK1), a plurality of nMOS transistors having their drains connected to the connection node between the two inverters, and capacitors arranged between the sources of the nMOS transistors and a ground lines VSS. The gates of the nMOS transistors receive the delay control signals PE1 to PEm, respectively. Then, the greater the number of delay control signals PE1 to PEm having high level is, the greater the load on the connection node becomes, with an increase in delay time.

Figure 21:
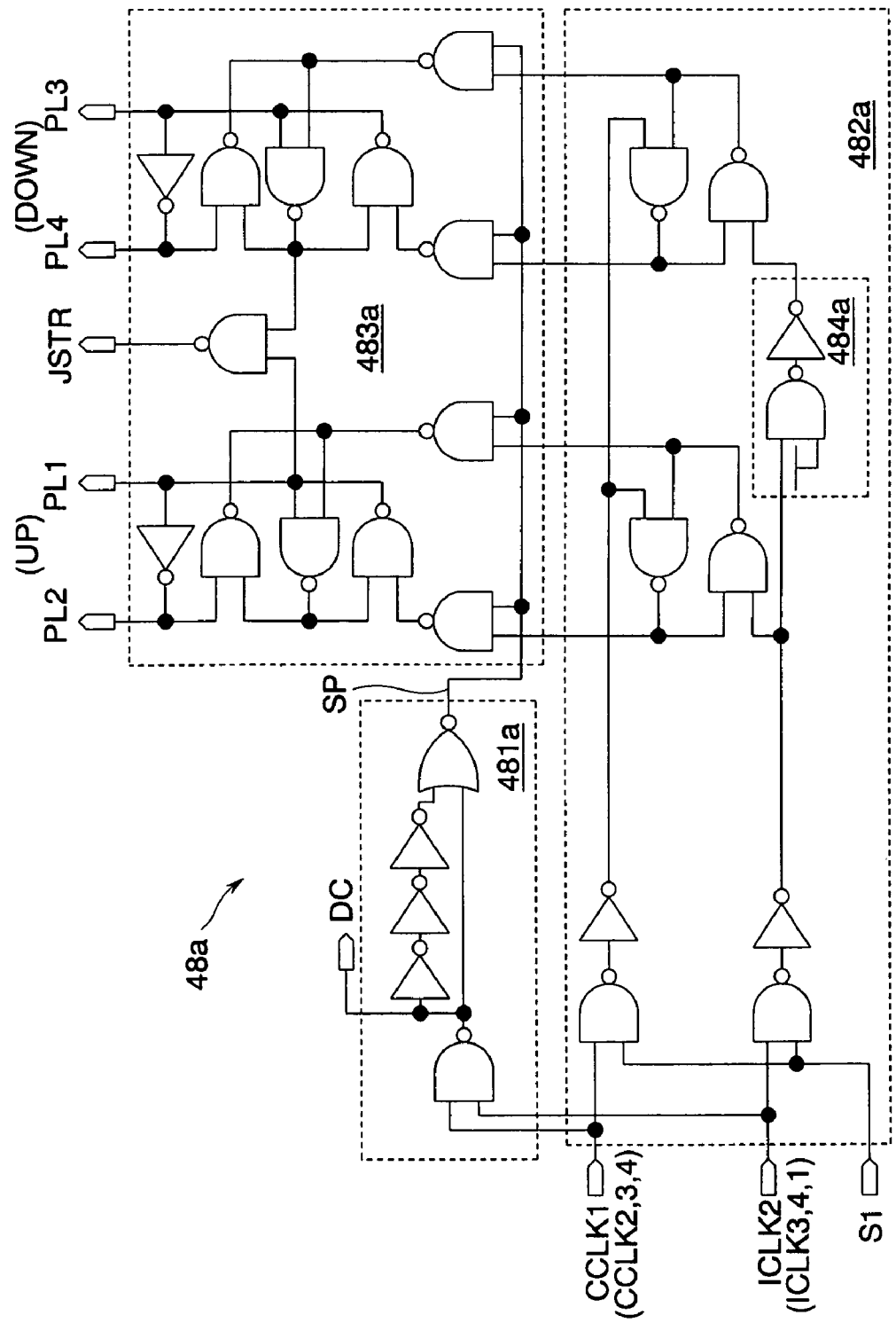
FIG. 21 is a circuit diagram showing the details of the rough phase comparator shown in FIG. 17.
Figure 23:
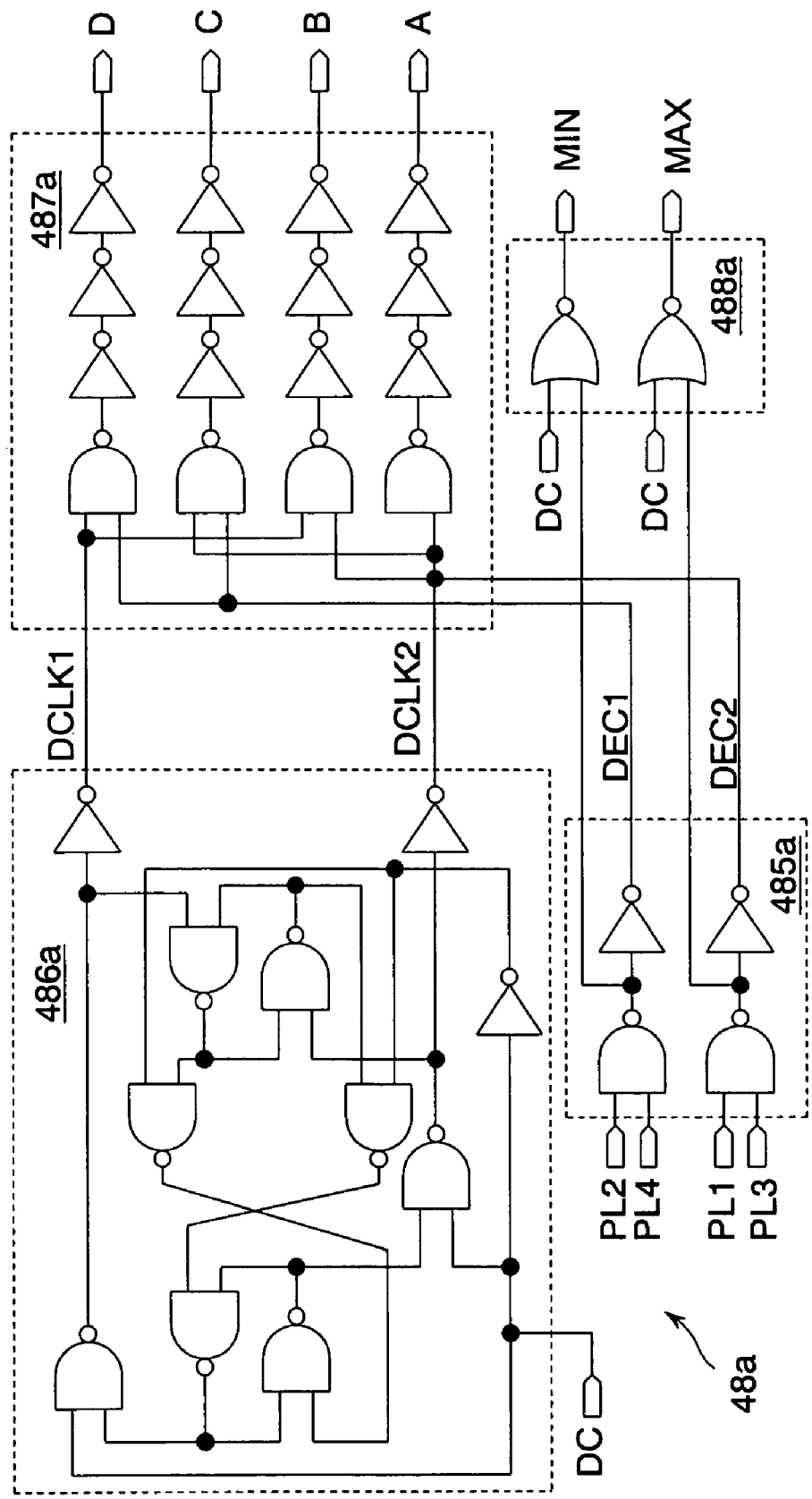
FIG. 23 is a circuit diagram showing the details of the rough phase comparator shown in FIG. 17.

FIGS. 21 and 23 show the details of the rough phase comparator 48*a* shown in FIG. 17. The same elements as those of the phase comparator 18 of the first embodiment will be designated by identical reference numbers or symbols. Detailed description thereof will be omitted. In FIG. 21, the rough phase comparator 48*a* has a sampling pulse generating unit 481*a*, a phase detecting unit 482*a*, and a latch unit 483*a*. The sampling pulse generating unit 481*a* generates the detection clock DC and a sampling pulse SP synchronously when the comparison clock CCLK1 (or one of CCLK2 to CCLK4) and the internal clock ICLK2 (or one of ICLK3, ICLK4, and ICLK1) both change to high level.

The phase detecting unit 482*a* has AND circuits for accepting the comparison clock CCLK1 and the internal clock ICLK2 during the activation period of the enable signal S1, two flip-flops connected in series with the outputs of the AND circuits, and a delay stage 484*a* arranged between the flip-flops. The delay stage 484a is the same circuit as the delay stages of the rough variable delay circuit 42a (the second variable delay circuit 14) shown in FIG. 17. The latch unit 483a latches the four output signals of the phase detecting unit 482a in synchronization with the sampling pulse SP, and outputs them as phase latch signals PL1 to PL4. The latch unit 483a outputs the lock-on signal JSTR during a period when the phase latch signals PL1 and PL4 both are at high level.

Figure 22:
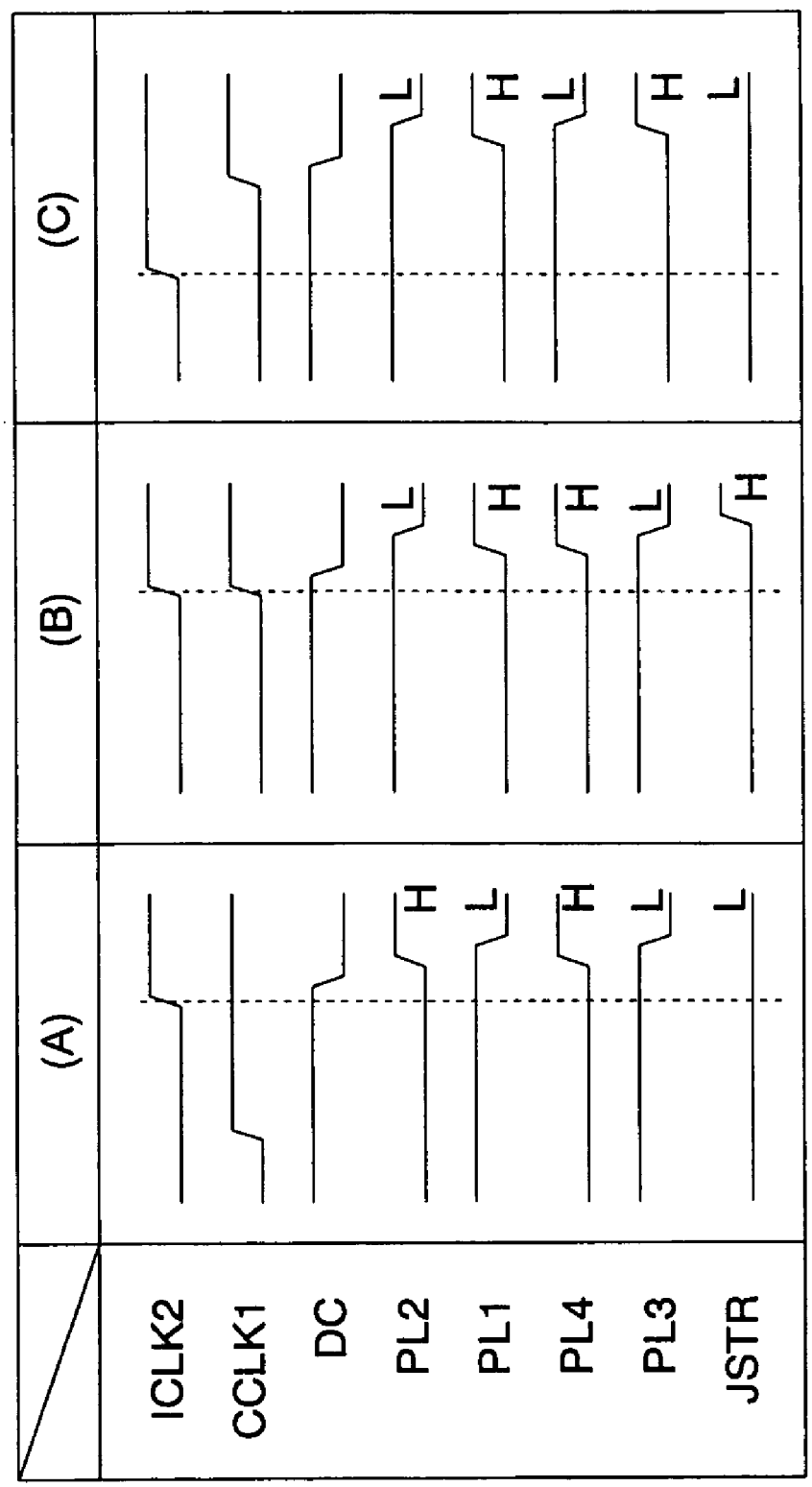
FIG. 22 is a waveform chart showing the operation of the phase detecting unit and the latch unit shown in FIG. 21.

FIG. 22 shows the operation of the phase detecting unit 482a and the latch unit 483a shown in FIG. 21. As in the first embodiment, when the comparison clock CCLK1 leads the internal clock ICLK2 in phase, the phase latch signals PL1 to PL4 change to L, H, L, and H (FIG. 22(A)). When the comparison clock CCLK1 coincides with the internal clock ICLK2 in phase, the phase latch signals PL1 to PL4 change to L, H, H, and L (FIG. 22(B)). When the comparison clock CCLK1 lags behind the internal clock ICLK2 in phase, the phase latch signals PL1 to PL4 change to H, L, H, and L (FIG. 22(C)). The lock-on signal JSTR changes to high level only when the comparison clock CCLK1 coincides with the internal clock ICLK2 in phase.

In FIG. 23, the rough phase comparator 48a has a decoding unit 485a, a frequency divider 486a, an output unit 487a, and a MAX/MIN output unit 488a. The decoding unit 485a decodes the phase latch signals PL1 to PL4, and outputs decoded signals DEC1 and DEC2. The frequency divider 486a divides the frequency of the detection clock DC by half to generate divided clocks DCLK1 and DCLK2 whose high level periods do not overlap each other. The output unit 487a outputs the control signals A, B, C, and D in accordance with the logic of the decoded signals DEC1 and DEC2. The MAX/MIN output unit 488a activates the minimum signal MIN to high level in synchronization with the falling edge of the detection clock DC when the decoded signal DEC1 of high level is output. When the decoded signal DEC2 of high level is output, the MAX/MIN output unit 488a activates the maximum signal MAX to high level in synchronization with the falling edge of the detection clock DC.

Incidentally, the fine phase comparator 48b shown in FIG. 17 is configured by: replacing, in the rough phase comparator 48a shown in FIG. 21, the delay stage 484a with the delay stages of the fine variable delay circuit 42b shown in FIG. 20 (composed of nMOS transistors and capacitors), changing the enable signal from S1 to S2, and deleting the circuit for generating the lock-on signal JSTR; and deleting, in the rough phase comparator 48a shown in FIG. 23, the circuit for generating the maximum signal MAX and the minimum signal MIN.

Figure 24:
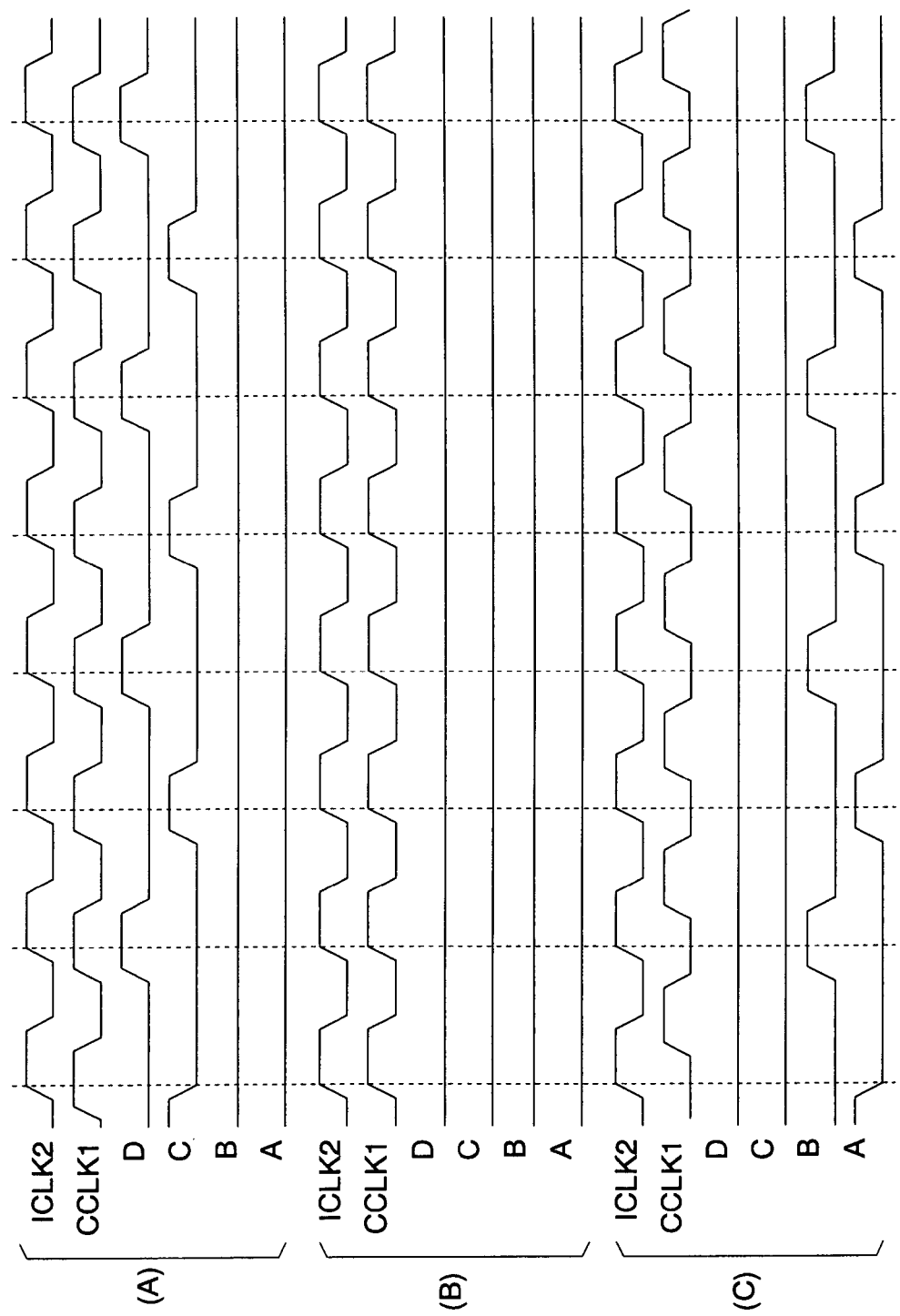
FIG. 24 is a timing chart showing the operation of the rough phase comparator shown in FIGS. 21 to 23.

FIG. 24 shows the operation of the rough phase comparator 48a shown in FIGS. 21 to 23. The fine variable delay circuit 42b shown in FIG. 20 also makes the same operation as in FIG. 24. This example shows the case of comparing the comparison clock CCLK1 with the internal clock ICLK2 in phase. The operations for comparing the comparison clocks CCLK2, CCLK3, and CCLK4 with the internal clocks ICLK3, ICLK4, and ICLK1 in phase are also the same. The rough phase comparator 48a outputs the control signals C and D when the comparison clock CCLK1 leads the internal clock ICLK2 in phase (FIG. 24(A)). It disables the output of the control signals A to D when the comparison clock CCLK1 coincides with the internal clock ICLK2 in phase (FIG. 24(B)). It outputs the control signals A and B in synchronization with the divided clocks DCLK2 and DCLK1, respectively, when the comparison clock CCLK1 lags behind the internal clock ICLK2 in phase (FIG. 24(C)).

Figure 25:
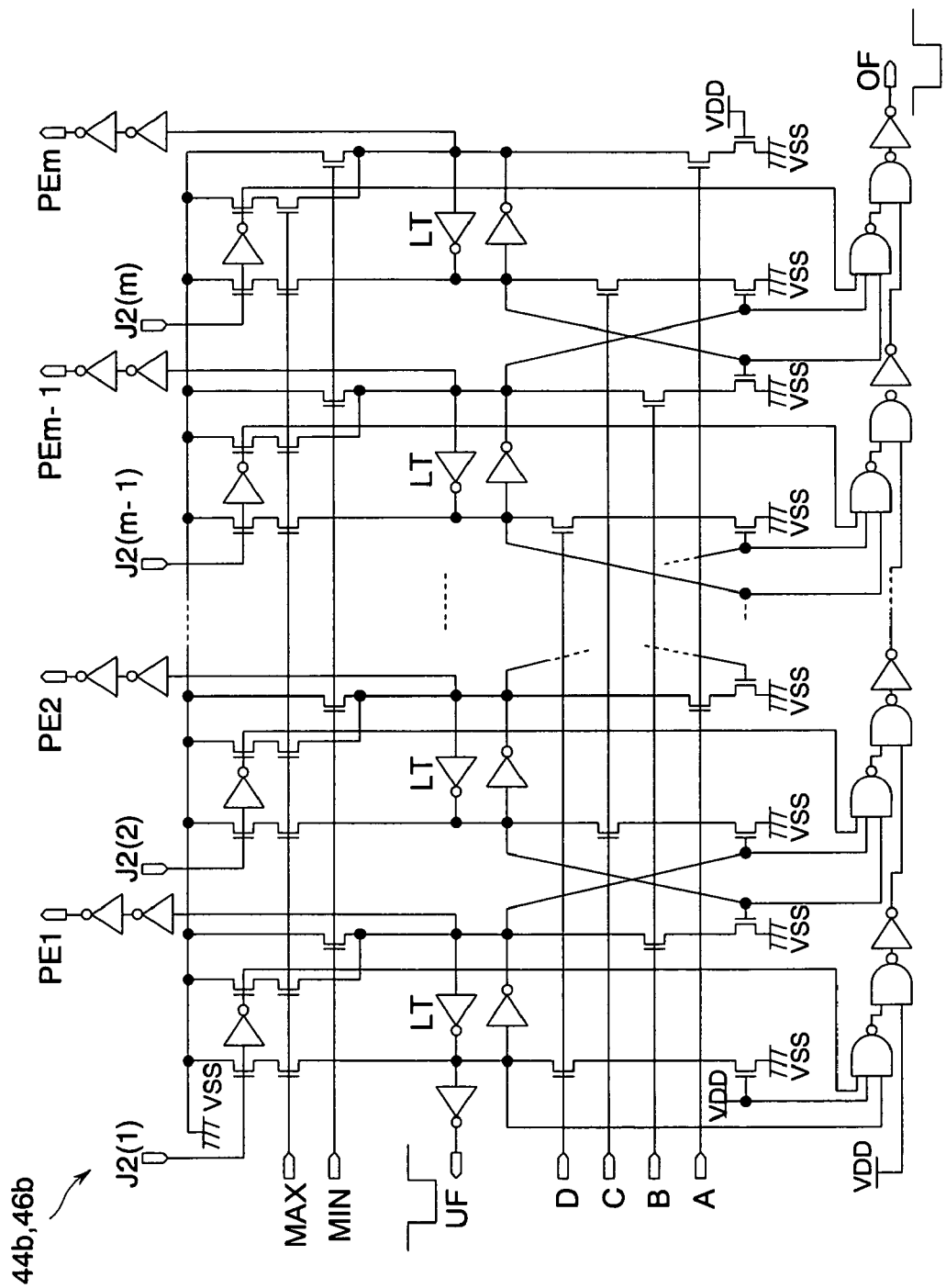
FIG. 25 is a circuit diagram showing the details of the fine delay control circuits shown in FIGS. 16 and 17.

FIG. 25 shows the details of the fine delay control circuits 44b and 46b shown in FIGS. 16 and 17. Since the fine delay control circuits 44b and 46b are the same circuits, the following description will deal with the fine delay control circuit 44b alone. The fine delay control circuit 44b is configured by providing the first delay control circuit 14 of the first embodiment with the additional functions of: outputting the overflow signal OF and the underflow signal UF; setting the delay adjustment signals PE1 to PEm again in order to maximize or minimize the delay time of the fine variable delay circuit 40b in accordance with the maximum signal MAX or the minimum signal MIN; and initializing the delay adjustment signals PE1 to PEm in accordance with the delay stage number J2 (delay stage number signals J2(1) to J2(m)) determined by the stage number setting circuit 56.

The maximum value of the delay time of the fine variable delay circuit 40b is set to the delay time of a single delay stage of the rough variable delay circuit 40a by means of the delay stage number signals J2(1) to J2(m). By the stage number setting circuit 56, the delay stage number signals J2(1) to J2(m) are set at high level in order from the left in the diagram. Suppose, for example, that the delay time of a single delay stage of the rough variable delay circuit 40a is equal to the delay time of 20 stages of the fine variable delay circuit 40b. Then, the delay stage number signals J2(1) to J2(20) are set at high level, and the subsequent delay stage number signals J2 are set at low level.

When the maximum signal MAX of high level is supplied, one ends (left in the diagram) of the latches LT corresponding to the delay stage number signals J2 of high level, out of all the latches LT each consisting of a pair of inverters, are set at low level. The delay adjustment signals PE output from these latches LT thus change to high level. Consequently, the delay time of the fine variable delay circuit 40b is set to the maximum value indicated by the delay stage number signals J2. When the minimum signal MIN of high level is supplied, one ends (right in the diagram) of the latches LT are all set at low level. Thus, all the delay adjustment signals PE1 to PEm change to low level. Consequently, the delay time of the fine variable delay circuit 40b is set to a minimum value.

The underflow signal UF is generated by inverting the logic level of one end of the latch LT that outputs the delay stage number signal J2(1). The underflow signal UF changes to low level when all the delay stage number signals J2(1) to J2(m) are set at low level and the delay time of the fine variable delay circuit 40b is set to the minimum value.

The overflow signal OF is generated by using three-input NAND gates, two-input NAND gates, and inverters which are connected in series. The three-input NAND gates that receive the delay stage number signals J2 of low level output low level if the corresponding delay adjustment signals PE are at low level and the delay adjustment signals PE of the respective prior stages are at high level. That is, when the delay adjustment signal PE immediately prior to the stage corresponding to the most significant one (right in the diagram) of the delay stage number signals J2 of high level changes to high level, the three-input NAND gate of the stage corresponding to the most significant signal outputs low level. This low level is transmitted to the subsequent two-input NAND gates and inverters in succession, and is output as the overflow signal OF of low level. The overflow signal OF of low level indicates that the delay time of the fine variable delay circuit 40b reaches the maximum value set by the delay stage number signals J2. Specifically, suppose that the delay stage number signals J2(1) to J2(20) are set at high level and the subsequent delay stage number signals J2 are set at low level. Then, the overflow signal OF of low level is output when the delay time of the fine variable delay circuit 40b is increased through a phase adjustment and the delay adjustment signals PE1 to PE20 are turned to high level.

Figure 26:
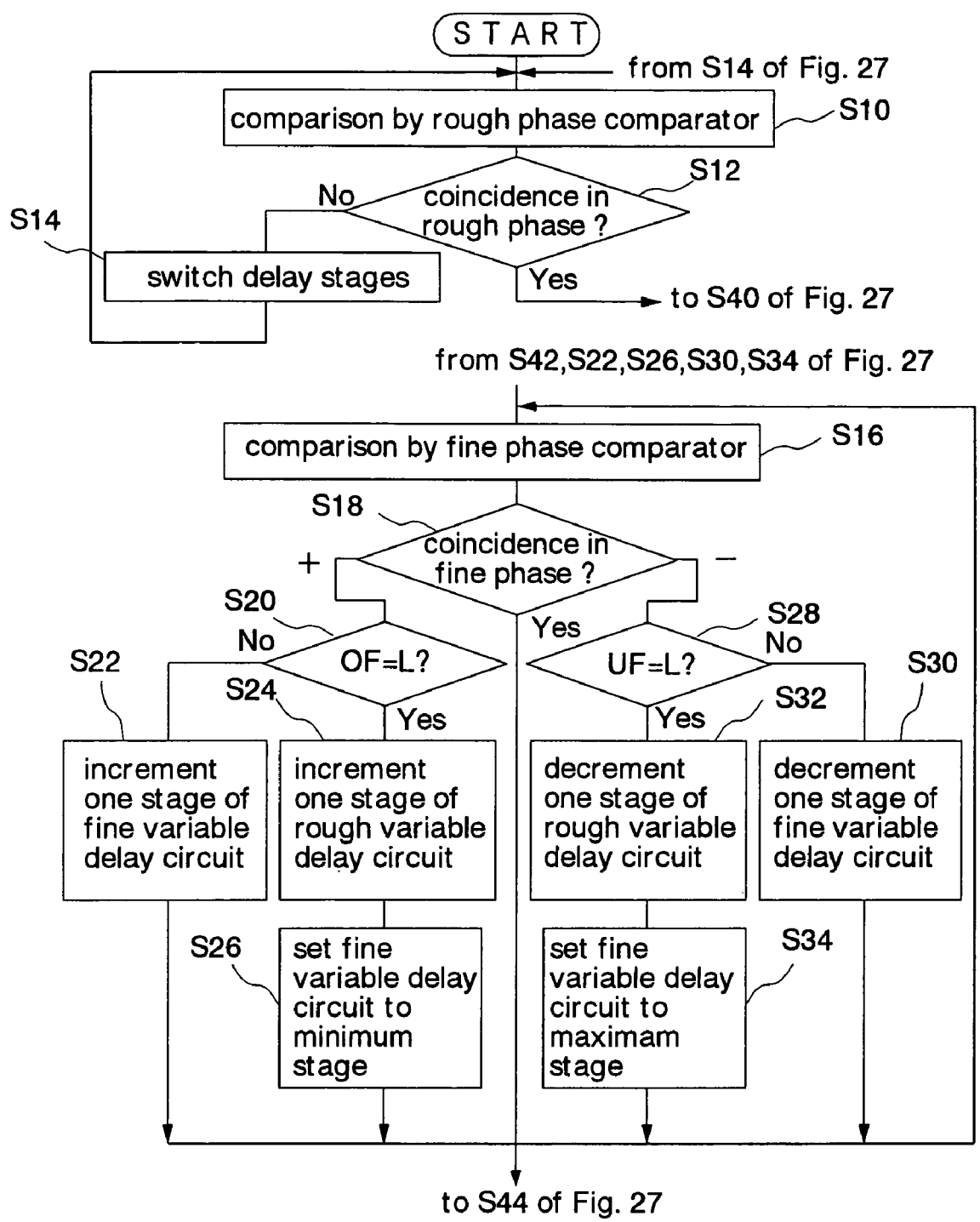
FIG. 26 is a flowchart showing the adjustment operation on the delay time by the second variable delay circuit shown in FIGS. 15 and 17.
Figure 27:
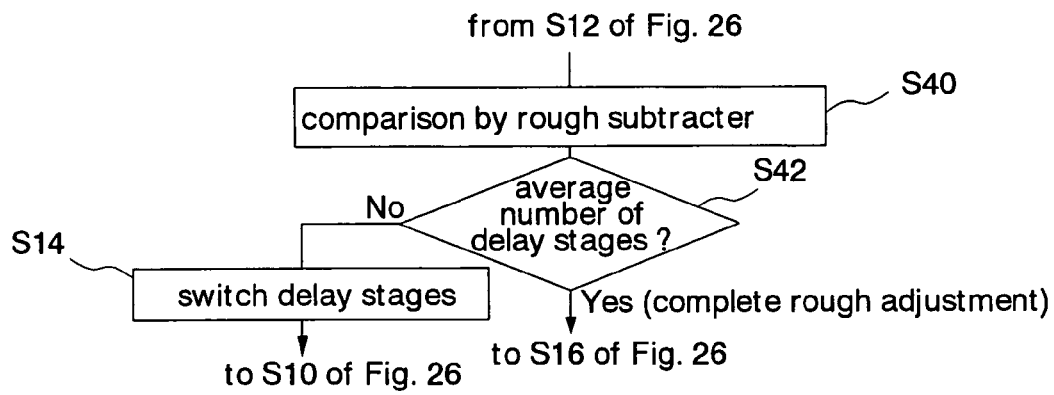
FIG. 27 is a flowchart showing the adjustment operation on the delay time by the first variable delay circuit shown in FIGS. 15 and 16.
Figure 27:
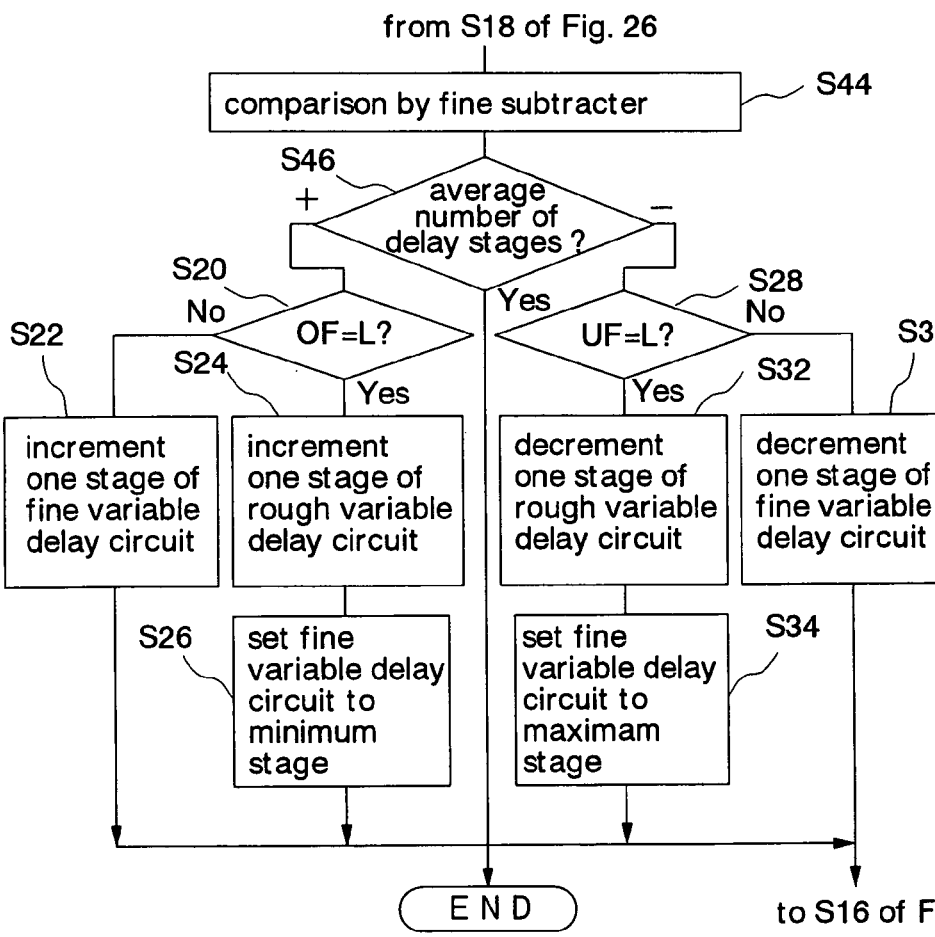

FIGS. 26 and 27 show the adjustment operation on the delay time of the second variable delay circuit 42 shown in FIGS. 15 and 17, and the adjustment operation on the delay time of the first variable delay circuit 40 shown in FIGS. 15 and 16. In this embodiment, as described above, the phase adjustment to the comparison clocks CCLK1 to CCLK4 is effected initially by adjusting the delay times of the rough variable delay circuits 42a and then by adjusting the delay times of the fine variable delay circuits 42b. The phase adjustment to the internal clocks ICLK1 to ICLK4 is effected initially by adjusting the delay times of the rough variable delay circuits 40a and then by adjusting the delay times of the fine variable delay circuits 40b. In FIG. 26, description will be given of the case of generating the comparison clock CCLK1 from the internal clock ICLK1. In FIG. 27, description will be given of the case of generating the internal clock ICLK1 from the external clock CLK1.

In this embodiment, the rough delay control circuit 46a of the second variable delay circuit 42 and the rough delay control circuit 44a of the first variable delay circuit 40 initially make operations alternately, so that all the phase differences between the internal clocks ICLK1 to ICLK4 are made equal by a rough adjustment. Next, the fine delay control circuit 46b of the second variable delay circuit 42 and the fine delay control circuit 44b of the first variable delay circuit 40 make operations alternately, so that all the phase differences between the internal clocks ICLK1 to ICLK4 are made precisely equal by a fine adjustment. Specifically, the phase adjustment of the first embodiment shown in FIGS. 3 to 6 is performed as the rough adjustment. Then, an operation similar to the phase adjustment shown in FIGS. 3 to 6 is performed as the fine adjustment. The fine adjustment is performed, for example, with the unit of adjustment to the delay time as 0.01 unit times.

Initially, at step S10 of FIG. 26, the comparison clock CCLK1 and the internal clock ICLK2 are compared in phase by the rough phase comparator 48a. At step S12, if there is no coincidence in phase, the processing moves to step S14. If there is a coincidence in phase, the processing moves to step S40 of FIG. 27. At step S14, the rough delay control circuit 46a operates to switch the delay stages of the rough variable delay circuit 42a, thereby setting the delay time again. Subsequently, the processing repeats steps S10 to S14 until the rough adjustment reaches a coincidence in phase.

Now, at step S16, the comparison clock CCLK1 and the internal clock ICLK2 are compared by the fine phase comparator 48b. At step S18, if there is no coincidence in phase and it is necessary to increase the delay time of the fine variable delay circuit 42b, the processing moves to step S20. If there is no coincidence in phase and it is necessary to decrease the delay time of the fine variable delay circuit 42b, the processing moves to step S28. If there is a coincidence in phase, the processing moves to step S44 of FIG. 27.

At step S20, whether or not the delay stage number of the fine variable delay circuit 42b has reached the maximum value is determined based on the overflow signal OF. If the overflow signal OF is at high level, the delay stage number is yet to reach the maximum value. Then, the processing moves to step S22. If the overflow signal OF is at low level, the delay stage number has reached the maximum value. Then, the processing moves to step S24. At step S22, the fine delay control circuit 46b operates to increment the delay stages of the fine variable delay circuit 42b by one (an increase in delay time). Subsequently, the processing moves to step S16.

At steps S24 and S26, since the delay stages of the fine variable delay circuit 42b cannot be incremented further, the delay stages of the rough variable delay circuit 42a are incremented by one (an increase in delay time) and the fine variable delay circuit 42b is set to the minimum stage (minimum delay time). Subsequently, the processing moves to step S16.

On the other hand, at step S28, whether or not the delay stage number of the fine variable delay circuit 42b has reached the minimum value is determined based on the underflow signal UF. If the underflow signal UF is at high level, the delay stage number is yet to reach the minimum value. Then, the processing moves to step S30. If the underflow signal UF is at low level, the delay stage number has reached the minimum value. Then, the processing moves to step S32. At step S30, the fine delay control circuit 46b operates to decrement the delay stages of the fine variable delay circuit 42b by one (a decrease in delay time). Subsequently, the processing moves to step S16.

At steps S32 and S34, since the delay stages of the fine variable delay circuit 42b cannot be decremented further, the delay stages of the rough variable delay circuit 42a are decremented by one (a decrease in delay time) and the fine variable delay circuit 42b is set to the maximum stage (maximum delay time). Note that the maximum stage here corresponds to the delay stage number J2 measured by the stage number setting circuit 62 shown in FIG. 18. Subsequently, the processing moves to step S16.

In FIG. 27, the processing of steps S14 and S20 to S34 is the same as that of steps S14 and S20 to S34 of FIG. 26. At step S40 of FIG. 27, the current delay stage number of the rough variable delay circuit 40a and the average delay stage number are compared by the rough subtracter 50a. At step S42, if there is no coincidence in the stage number, the processing moves to step S14. If there is a coincidence in the stage number, the rough adjustment is completed and the processing moves to step S16 of FIG. 26. After step S14, the processing moves to step S10 of FIG. 26.

At step S44, the current delay stage number of the fine variable delay circuit 40b and the average delay stage number are compared by the fine subtracter 50b. At step S46, if there is no coincidence in the stage number and it is necessary to increase the delay time of the fine variable delay circuit 40b, the processing moves to step S20. If there is no coincidence in phase and it is necessary to decrease the delay time of the fine variable delay circuit 40b, the processing moves to step S28. After the processing of steps S20 to S34 is performed as in FIG. 26, the processing moves to step S16 of FIG. 26. On the other hand, if there is a coincidence in phase, the processing completes the phase adjustment operation.

As above, the second embodiment can provide the same effects as those of the first embodiment described above. Moreover, in this embodiment, the fine variable delay circuits 40b and 42b can be used to make the phase differences between the internal clocks ICLK1 to ICLK4 equal precisely. As a result, it is possible to reduce the jitter in the individual internal clocks ICLK1 to ICLK4 shown in FIG. 7 (variations in phase due to the tenth and subsequent comparisons), and evaluate the timing specifications tRCD, tDPL, and the like more accurately. Incidentally, although not shown in the drawings, the first variable delay circuits 40 may be made of the fine variable delay circuits (the circuits corresponding to 40b in FIG. 16) alone.

Figure 28:
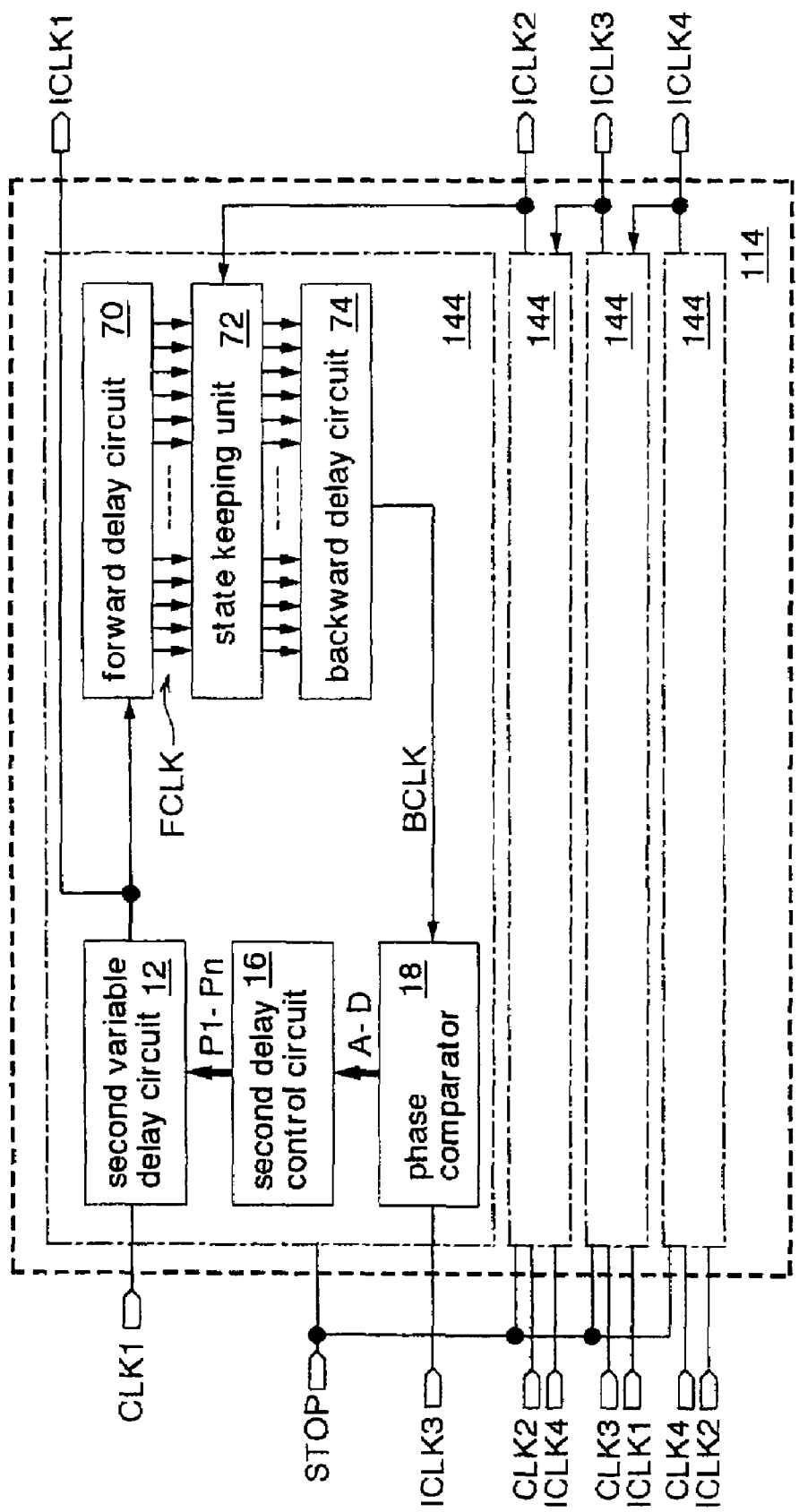
FIG. 28 is a block diagram showing the phase adjustment unit according to a third embodiment of the semiconductor integrated circuit of the present invention.

FIG. 28 shows a phase adjustment unit 114 according to a third embodiment of the semiconductor integrated circuit of the present invention. As in the first embodiment, this semiconductor integrated circuit is formed on a silicon substrate by using CMOS processes, as a clock synchronous SDRAM. The SDRAM has the phase adjustment unit 114 instead of the phase adjustment unit 110 of the first embodiment. The rest of the configuration is the same as in the first embodiment. Incidentally, the same elements as those described in the first embodiment will be designated by identical reference numbers or symbols. Detailed description thereof will be omitted.

The phase adjustment unit 114 has sub phase adjustment units 144 corresponding to the external clocks CLK1 to CLK4, respectively. Since all the sub phase adjustment units 144 have the same circuit configuration, the following description will deal only with the sub phase adjustment unit 144 that receives the external clock CLK1.

The sub phase adjustment unit 144 has a second variable delay circuit 12, a second delay control circuit 16, and a phase comparator 18 identical to those of the first embodiment, as well as a forward delay circuit 70, a state keeping unit 72, and a backward delay circuit 74. The second variable delay circuit 12 delays the external clock CLK1 in phase to generate the internal clock ICLK1. The second delay control circuit 16 adjusts the delay time of the second variable delay circuit 12 in accordance with the control signals A, B, C, and D output from the phase comparator 18. The phase comparator 18 compares a backward clock BCLK output from the backward delay circuit 74 and the internal clock ICLK3 (second adjacent clock) in phase, and outputs the result of comparison in the form of the control signals A, B, C, and D.

The forward delay circuit 70 is composed of a plurality of delay stages connected in cascade. The delay stages output a plurality of forward clocks FCLK, or the internal clock ICLK1 delayed in succession, to the state keeping unit 72. The state keeping unit 72 selects a forward clock FCLK having the same phase as that of the internal clock ICLK2 (first adjacent clock), and outputs the selected forward clock FCLK to the backward delay circuit 74. The backward delay circuit 74 delays the selected forward clock FCLK by using the same number of delay stages as the delay stage number (internal delay time) of the forward delay circuit 70 required for outputting the selected forward clock FCLK, and outputs the resultant as the backward clock BCLK. Consequently, the forward clock FCLK and the backward clock BCLK have the same phase difference as that between the internal clock ICLK1 and the forward clock FCLK. The circuitry consisting of the forward delay circuit 70, the state keeping unit 72, and the backward delay circuit 74 is typically referred to as a synchronous mirror delay (SMD) because the forward delay circuit 70 and the backward delay circuit 74 always have the same delay stage numbers. Like DLLs, SMDs are often used to establish a coincidence in phase between two clocks.

In this embodiment, the forward delay circuit 70 and the state keeping unit 72 are supplied with the internal clocks ICLK1 and ICLK2 (ICLK2 and ICLK3, ICLK3 and ICLK4, or ICLK4 and ICLK1), respectively. To establish a coincidence in phase between the internal clock ICLK3 (ICLK4, ICLKI, or ICLK2) and the backward clock BCLK output from the backward delay circuit 74, the delay time of the second variable delay circuit 12 is adjusted by the phase comparator 18 and the second delay control circuit 16. Consequently, all the phase differences between the internal clocks ICLK1, ICLK2, and ICLK3, the phase differences between ICLK2, ICLK3, and ICLK4, the phase differences between ICLK3, ICLK4, and ICLK1, and the phase differences between ICLK4, ICLK1, and ICLK2 become equal. As a result, the phase differences between the four ICLK1 to ICLK4 are all adjusted to be equal.

As above, the third embodiment can provide the same effects as those of the first embodiment described above. Moreover, in this embodiment, all the phase differences between the internal clocks ICLK1 to ICLK4 can be made equal through the use of the SMD technology.

Figure 29:
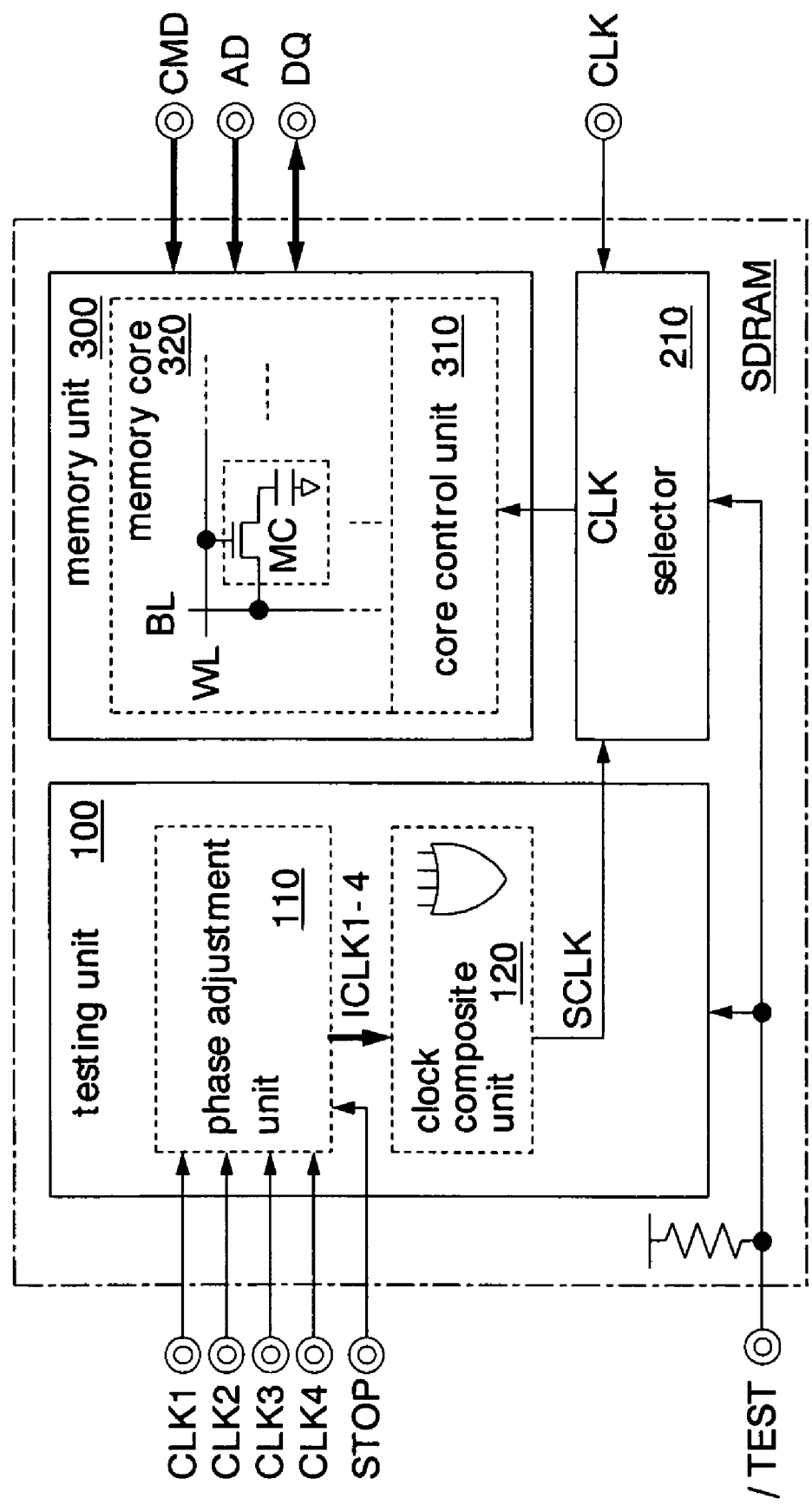
FIG. 29 is a block diagram showing a fourth embodiment of the semiconductor integrated circuit of the present invention.

FIG. 29 shows a fourth embodiment of the semiconductor integrated circuit of the present invention. As in the first embodiment, this semiconductor integrated circuit is formed on a silicon substrate by using CMOS processes, as a clock synchronous SDRAM. The same elements as those described in the first embodiment will be designated by identical reference numbers or symbols. Detailed description thereof will be omitted. The SDRAM is configured by removing the BIST circuit from the SDRAM of the first embodiment. Besides, the selector 210 is used only for clock selection. The selector 210 selects the composite clock SCLK in test mode, selects the external clocks CLK in normal operation mode, and supplies the selected clock to the memory unit 300. The command CMD, address AD, and data DQ are supplied to the memory 300 directly. The rest of the configuration is the same as in the first embodiment. As above, the fourth embodiment can provide the same effects as those of the first embodiment described above.

Incidentally, the foregoing embodiments have dealt with the cases where the present invention is applied to an SDRAM. However, the present invention is not limited to such embodiments. For example, the present invention may be applied to CPUs and other semiconductor integrated circuits which operate in synchronization with a clock.

The foregoing embodiments have dealt with the cases where the internal clocks ICLK1 to ICLK4 and the composite clock SCLK are generated by using the four external clocks CLK1 to CLK4. However, the present invention is not limited to such embodiments. For example, the internal clocks and the composite clock SCLK may be generated by using a plurality of external clocks other than four.

The foregoing fourth embodiment has dealt with the case of using the phase adjustment unit 110 of the first embodiment. Nevertheless, the phase adjustment units 112 and 114 of the second and third embodiments may be used for configuration.

The invention is not limited to the above embodiments and various modifications may be made without departing from the spirit and scope of the invention. Any improvement may be made in part or all of the components.

What is claimed is:

1. A semiconductor integrated circuit comprising:
external clock terminals receiving a plurality of external clocks having phases shifted in sequence, respectively;
a phase adjustment unit adjusting the phases of said external clocks to generate a plurality of internal clocks with a same phase difference between every adjacent transition edges thereof;
a clock composite unit synthesizing the internal clocks to generate a composite clock having a frequency higher than that of the external clocks; and
an internal circuit operating in synchronization with the composite clock,
wherein:
said phase adjustment unit includes:
a plurality of sub phase adjustment units corresponding to the external clocks, respectively, each having first and second variable delay circuits, a phase comparator, and first and second delay control circuits; and an average calculation unit calculating an average delay time which is an average of delay times of said second variable delay circuits in all of said sub phase adjustment units, and wherein in each of said sub phase adjustment units:

said first variable delay circuit delays a corresponding external clock in phase to generate the internal clock;

said second variable delay circuit delays the internal clock in phase to generate a comparison clock;

said phase comparator compares phases of the comparison clock and one of the internal clocks generated from one of the external clocks having a transition edge adjacent to that of another one of the external clocks and delaying in phase from the another one of the external clocks which corresponds to the comparison clock;

said second delay control circuit adjusts the delay time of said second variable delay circuit in accordance with a result of the comparison by said phase comparator in order to make the comparison clock and the internal clock compared by said phase comparator coincide in phase with each other; and said first delay control circuit increases the delay time of said first variable delay circuit when the delay time of said second variable delay circuit is longer than the average delay time, and decreases the delay time of said first variable delay circuit when the delay time of said second variable delay circuit is shorter than the average delay time.

2. The semiconductor integrated circuit according to claim 1, wherein said first delay control circuit adjusts the delay time of said first variable delay circuit after said second delay control circuit adjusts the delay time of said second variable delay circuit and said phase comparator detects a coincidence in phase.

3. The semiconductor integrated, circuit according to claim 2, wherein after making the first delay control circuits adjust the delay times of the first variable delay circuits by a unit time, said sub phase adjustment units make the phase comparators repeat the phase comparison operation, the first and second delay control circuits repeat the adjustment operation on the delay times until said phase comparators detect a coincidence in phase and the delay times of all of said second variable delay circuits become equal to the average delay time.

4. The semiconductor integrated circuit according to claim 2, wherein the first delay control circuits in all of said sub phase adjustment units adjust the delay times of said first variable delay circuits simultaneously.

5. The semiconductor integrated circuit according to claim 1, further comprising an adjustment stop terminal receiving an adjustment stop signal, wherein said phase adjustment unit stops the phase adjustment operation to the internal clocks in response to the adjustment stop signal.

6. The semiconductor integrated circuit according to claim 1, further comprising:

a normal operation mode and a test mode;

an operation clock terminal receiving an operation clock; and a selector selecting the operation clock in the normal operation mode and the composite clock in the test mode, and transmitting a selected clock to said internal circuit, wherein said internal circuit operates in synchronization with the operation clock in the normal operation mode, and operates in synchronization with the composite clock in the test mode.

7. The semiconductor integrated circuit according to claim 6, wherein said phase adjustment unit is activated to generate the internal clock only in the test mode.

8. The semiconductor integrated circuit according to claim 6, comprising a testing unit operating in the test mode to generate a plurality of types of commands for operating said internal circuit in succession in synchronization with the composite clock, wherein said internal circuit includes a memory core having a plurality of memory cells, and a core control unit making said memory core perform a read operation or a write operation on said memory cells, upon receiving said commands in succession.

9. The semiconductor integrated circuit according to claim 8, wherein:

said memory core has word lines and bit lines connected to said memory cells;

said external clock terminals are four in number; and said testing unit includes a command generator successively generating, in synchronization with pulses of the composite clock, an active command for activating the word lines, a read command or a write command for reading or writing data from/to any one of said memory cells connected to an activated word line, a precharging command for precharging the bit lines after inactivation of the word lines, and a deselect command for setting said memory core to be in a nonoperation state, the pulses corresponding to four external clocks, respectively.

10. The semiconductor integrated circuit according to claim 9, wherein said testing unit includes:

a row address counter generating a row address for selecting the word lines, in synchronization with the active command;

a column address counter generating a column address for selecting the bit lines, in synchronization with the read command and the write command; and a data generator generating write data in synchronization with the write command.

* * * * *